(12) United States Patent
Gizdarski

(10) Patent No.: US 8,914,695 B2
(45) Date of Patent: Dec. 16, 2014

(54) SYNTHESIZING CIRCULAR DECOMPRESSORS

(75) Inventor: Emil I. Gizdarski, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 344 days.

(21) Appl. No.: 13/109,570

(22) Filed: May 17, 2011

(65) Prior Publication Data

US 2012/0239995 A1 Sep. 20, 2012

Related U.S. Application Data

(60) Provisional application No. 61/452,528, filed on Mar. 14, 2011.

(51) Int. Cl.
*G01R 31/28* (2006.01)
*G11C 19/00* (2006.01)
*G01R 31/3185* (2006.01)
*G01R 31/3183* (2006.01)

(52) U.S. Cl.
CPC *G01R 31/318547* (2013.01); *G01R 31/318335* (2013.01); *G01R 31/318544* (2013.01)
USPC ............... 714/732; 714/729; 377/72

(58) Field of Classification Search
CPC ............... G01R 31/318547; G01R 31/318335; G01R 31/318385; G01R 31/318536; G01R 31/318566; G01R 31/318533; G01R 31/318555; G01R 31/318563; G01R 31/318541; G01R 31/318544; G01R 31/318592; G01R 31/318392; G11C 2029/3202
USPC ......... 714/732, 726, 724, 729, 733, 734, 741, 714/30, 33; 377/64, 69, 72, 77, 81
See application file for complete search history.

(56) References Cited

U.S. PATENT DOCUMENTS

| | | | | |
|---|---|---|---|---|
| 7,590,905 | B2 * | 9/2009 | Abdel-Hafez et al. | 714/726 |
| 7,925,947 | B1 * | 4/2011 | Touba et al. | 714/732 |
| 7,996,741 | B2 * | 8/2011 | Touba et al. | 714/732 |
| 8,166,359 | B2 * | 4/2012 | Rajski et al. | 714/732 |

* cited by examiner

*Primary Examiner* — Christine Tu
(74) *Attorney, Agent, or Firm* — Park, Vaughan, Fleming & Dowler LLP

(57) ABSTRACT

Methods and apparatuses are described for decompressing and routing test data. Some embodiments feature an integrated circuit (IC) that includes two or more shift registers configured to shift in the test data. Each of the two or more shift registers can include two or more sequential elements configured such that a scan chain in the set of scan chains receives inputs from at most one sequential element in each of the two or more shift registers. At least one shift register in the two or more shift registers can be configured as a circular shift register. The IC can also include a logic network coupled between the two or more shift registers and the set of scan chains such that the set of scan chains receives the decompressed test data from the two or more shift registers via the logic network.

27 Claims, 20 Drawing Sheets

SYNTHESIZING CIRCULAR DECOMPRESSORS

RELATED APPLICATION

This application claims priority to U.S. Provisional Application No. 61/452,528, entitled "Method and Apparatus for Synthesizing Circular Decompressors," by Emil I. Gizdarski, filed 14 Mar. 2011, the contents of which are herein incorporated by reference.

BACKGROUND

1. Technical Field

This disclosure is generally related to electronic design automation in the integrated circuit industry. More specifically, this disclosure is related to techniques for testing integrated circuits and, in particular, for synthesizing decompressors for test stimulus decompression.

2. Related Art

Electronic design automation (EDA) is used by the semiconductor industry for virtually all integrated circuit (IC) design projects. More specifically, after developing a product idea, EDA tools are used to define a specific implementation. The implementation defined using the EDA tools is then used to create mask data, which is subsequently used for producing masks in the production of the finished chips, in a process referred to as "tape-out." The physical masks are then created and used with fabrication equipment to manufacture IC wafers. Testing is typically performed on the IC wafers to identify defective wafers. Next, diagnosis is applied to the defective wafers to identify root-causes for systematic defects, wherein the identified root-causes are used for mask correction in order to improve manufacture yield. Finally, the wafers are diced, packaged and assembled to produce IC chips for distribution.

An IC design flow using EDA tools typically begins with an overall system design using architecture defining tools that describe the functionality of the product to be implemented by the IC. Next, logic design tools are applied to the overall system description to create a high-level description based on description languages such as Verilog or VHDL, and functional verification tools are applied on the high-level description in an iterative process to ensure that the high-level description accomplishes the design objectives. Next, synthesis and design-for-test tools are used to translate the high-level description to a netlist, optimize the netlist for target technology, and design and implement tests that permit checking of the finished chip against the netlist.

The typical design flow might next include a design planning stage, wherein an overall floor plan for the chip is constructed and analyzed to ensure that timing parameters for the netlist can be achieved at a high level. Next, the netlist may be rigorously checked for compliance with timing constraints and with the functional definitions defined at the high level using VHDL or Verilog. After an iterative process which settles on a netlist and maps the netlist to a cell library for the final design, a physical implementation tool is used for placement and routing. Specifically, the physical implementation tool includes a placement tool for positioning circuit elements on the layout, and a routing tool for defining interconnects for the circuit elements.

The components defined after placement and routing are typically analyzed at the transistor level using an extraction tool, and verified to ensure that the circuit function is achieved and timing constraints are met. The placement and routing process can be revisited as needed in an iterative manner.

Next, the design is subjected to physical verification procedures, such as design rule checking (DRC), layout rule checking (LRC) and layout versus schematic (LVS) checking, that analyze manufacturability, electrical performance, lithographic parameters and circuit correctness.

After settling on an acceptable design by iteration through design and verification steps, such as those described above, the resulting design can be subjected to resolution enhancement techniques that provide geometric manipulations of the layout to improve manufacturability. Finally, the mask data is prepared and taped-out for use in producing finished products.

An IC generated from the above-described design flow typically includes circuitry that allows the finished product to be tested. Note that efficient testing of ICs often uses structured design for testability (DFT) techniques. In particular, these techniques may be based on the general concept of making all or some state variables (e.g., memory elements such as flip-flops and latches in the circuit) directly controllable and observable. One of the well-known DFT techniques is based on scan chains. This technique assumes that during testing all (or substantially all) memory elements are coupled together to form one or more shift registers. As a result, a logic circuit in an IC design can have two or more modes of operation, including a normal mode and a test (or scan) mode. In the normal mode, the memory elements perform their regular design functions. In the scan mode, the memory elements become scan cells that are coupled to form the one or more shift registers which are often referred to as "scan chains." During the scan mode, these scan chains are used to shift the test stimulus into a circuit under test (CUT) and shift out test responses. More specifically, the scan mode involves applying a test pattern to the scan chains, which further includes scanning in the test stimulus, applying one or more functional clocks, and then scanning out the captured test response. The test responses are then compared with fault-free test responses to determine whether the CUT works properly.

Scan-based design techniques have been widely used to simplify testing and diagnose ICs. From the viewpoint of automatic test pattern generation (ATPG), a scan circuit can be treated as a combinational or partially combinational circuit. Currently, ATPG tools are capable of generating a complete set of test patterns based on different fault models, including stuck-at, transition, path delay, and bridging faults. Typically, when a particular fault in a CUT is targeted by an ATPG tool, only a small number of scan cells needs to be specified and one scan cell needs to be observed in order to detect this particular fault.

Note that in order to reduce test data volume and test application time, scan-based design techniques typically generate a compacted test stimulus and compacted test response rather than loading the entire test stimulus and unloading the entire test response. FIG. 1 presents a block diagram illustrating an IC 100 having an on-chip test compression capability. As is illustrated in FIG. 1, a tester 102 is coupled to IC 100 which comprises a CUT 104 which further includes a set of M scan chains, a decompressor 106, and a compressor 108. Decompressor 106 is configured to receive the compacted test stimulus from tester 102 and expand the compacted test stimulus to fill the M scan chains in CUT 104. Compressor 108 is configured to compress the test responses from the M scan chains and send the compacted test responses to tester 102.

FIG. 2 illustrates a number of conventional linear or nonlinear decompressor schemes. Generally, decompressor schemes can be classified as either combinational or sequential. A combinational decompressor, for example decompressor 202, comprises a combinational block 204 typically including XOR, NXOR, and MUX gates such that the loaded test stimuli of each scan chain are derived as a logic function of tester channels. This design scheme uses simple hardware and control logic. However, the drawback of this scheme is that combinational decompressors have to encode all specified care bits in the test stimulus in one shift cycle using only test data bits (or variables) supplied from the tester for this shift cycle (typically comprising one test data bit for each tester channel). This drawback can seriously limit the achievable compression ratio for the most highly specified shift cycles because the number of tester channels needs to be sufficiently large to encode the most highly specified shift cycles.

Sequential decompressors are based on linear finite state machines such as shift registers, linear feedback shift registers (LFSRs), cellular automata, or ring generators. For example decompressor 206 which comprises a shift register 208 and a combination block 210 is illustrated in FIG. 2. The sequential decompressors allow variables from earlier shift cycles to be used for encoding care bits in the current shift cycle. This property allows the sequential decompressors to provide much higher encoding flexibility than the combinational decompressors, and also helps to avoid the problem of the most highly specified shift cycles associated with the combinational decompressors. More recently, sequential linear decompressor designs often include a phase shifter placed between the scan chains and the LFSR or the ring generator to further improve encoding efficiency. One such example, decompressor 212 comprising a LFSR 214 and a phase shifter 216, is illustrated in FIG. 2.

Typically, a decompressor (either combinational or sequential) receives test data bits supplied by the tester represented by a set of variables $\{v_0, v_1, \ldots, v_{n-1}\}$ and attempts to generate a test sequence C comprising a set of specified care bits $\{c_0, c_1, \ldots, c_{m-1}\}$, which is also referred to as a "test cube." This process is often referred to as "encoding" a test cube. A decompressor can generate the test cube C if and only if there exists a solution to a system of linear equations AV=C, wherein A is an n×m characteristic matrix specifying the decompressor, and V is the set of variables $\{v_0, v_1, \ldots, v_{n-1}\}$. (The characteristic matrix for a decompressor is typically derived by symbolic simulation of the decompressor such that each symbol represents one variable.) Hence, encoding a test cube using a decompressor requires solving a system of linear equations of the set of variables which is composed of one linear equation for each care bit. If no solution exists, then the test cube is considered "unencodable." Note that it is difficult to encode a test cube that has more care bits than the number of available variables (or test data bits). However, if the number of variables is sufficiently larger than the number of care bits in the test cube, the probability of not being able to encode the test cube becomes negligibly small. For an LFSR with a primitive polynomial, if the number of variables is 20 more than the number of specified care bits, then the probability of not finding a solution (or an encoding conflict) is often less than $10^{-6}$.

On the other hand, the conventional sequential linear decompressor based on LFSRs or ring generators can imply very complex dependencies because each scan cell in the CUT can depend on the XOR of a large number of variables. Incorporating such complex dependencies in the ATPG implication process can greatly increase the computational complexity of the ATPG. For example, consider a scan cell whose state depends on q variables. In order to justify a particular state at this scan cell, q variables need to be assigned, and the number of possible ways to assign each variable with a value of 0 or 1 would be $2^q-1$. As q increases, this computational complexity grows exponentially. For this reason, the conventional sequential linear decompressors based on LFSRs or ring generators typically do not attempt to directly include the dependencies in the ATPG implication process. Because of this limitation, the conventional sequential linear decompressors do not fully utilize the degree of freedom in the ATPG.

Hence, it is desirable to design a decompressor which has the following properties: 1) a very high encoding efficiency; 2) a flexible mechanism to receive as many variables as needed; 3) a computationally efficient encoding process that can be directly incorporated into the ATPG implication process; and 4) an ability of the encoding process to extract as many as possible (or all) necessary state assignments due to dependency in the decompressor scheme.

SUMMARY

One embodiment provides an integrated circuit (IC) for decompressing test data from a tester and routing the decompressed test data into a set of scan chains within a circuit under test. The IC typically includes two or more shift registers configured to shift in the test data. More specifically, each of the two or more shift registers includes two or more sequential elements configured such that a scan chain in the set of scan chains receives inputs from at most one sequential element in each of the two or more shift registers. Moreover, at least one shift register in the two or more shift registers is configured as a circular shift register. The IC also includes a logic network coupled between the two or more shift registers and the set of scan chains such that the set of scan chains receives the decompressed test data from the two or more shift registers via the logic network.

In some embodiments, the sequential elements in the at least one circular shift register are configured such that each sequential element receives test data from exactly one sequential element and supplies test data to exactly one sequential element.

In some embodiments, the logic network includes a set of logic gates.

In some embodiments, the set of logic gates includes a set of XOR gates.

In some embodiments, each of the set of XOR gates receives inputs from at most one sequential element within each of the two or more shift registers.

In some embodiments, each of the set of XOR gates is coupled to each of the two or more shift registers. Moreover, each of the set of XOR gates is coupled to a unique one of the set of scan chains.

In some embodiments, each of the two or more shift registers is configured as a circular shift register.

In some embodiments, a pair of shift registers of the two or more shift registers are serially coupled such that a first sequential element of a first shift register is coupled to a last sequential element of a second shift register.

In some embodiments, the test data from the tester includes at least one control bit wherein a state 0 and 1 of the at least control bit selectively determines that a scan chain of the set of scan chains receives test data from a first set of sequential elements and a second set of sequential elements, respectively, wherein the first and second sets of sequential elements have at least one unique sequential element.

In some embodiments, each of the two or more shift registers includes the same number of sequential elements.

In some embodiments, the two or more shift registers include a first shift register of length M and a second shifter register of length N (M and N are relative prime), wherein the first and second shift registers are coupled to the same groups of the set of scan chains.

In some embodiments, the decompressor circuit is configured to route the decompressed test data to the set of scan chains by using one of: 1) a static reseeding operation; 2) a dynamic reseeding operation; 3) a dynamic partial reseeding operation; and 4) a combination of the above.

In some embodiments, the decompressor circuit uses a streaming channel coupled to the set of scan chains to perform a dynamic reseeding operation.

In some embodiments, each of the set of scan chains is associated with a unique triplet identifier (x, y, z), wherein x, y, z are integer numbers between 0 and N−1 (N≥2). Furthermore, the two or more shift registers include K (K≥4) shift registers $R_i$ (i=0, 1, . . . , K−1) of length at least N (N≥2), wherein the K shift registers are augmented by formulas: x, [(x+y) mod N], y, [(x+z) mod N], z, [(y+z) mod N] such that a formula is assigned to each shift register $R_i$.

In some embodiments, the logic network includes a set of connections such that each scan chain (x, y, z) is connected to the nth sequential element in each of the K shift registers $R_i$ (i=0, 1, . . . , K−1). Note that n∈{0, 1, 2, . . . , N−1} is the position of the connected sequential element in the respective shift register, and n equals the formula augmenting the respective shift register evaluated by the set of numbers (x, y, z).

In some embodiments, a scan chain (x, y, z) is decoupled from a shift register $R_j$ within the K shift registers, wherein j=(x+y+z) mod G and G is the larger one of (N, K).

In some embodiments, coupling between the scan chains and six shift registers $R_i$ (i=0, 1, . . . , 5) is changed by a control bit. The six shift registers may be divided into a first group $\{R_0, R_2, R_4\}$ and a second group $\{R_1, R_3, R_5\}$ based on certain characteristics of the respective formulas. The shift registers in the first groups can be swapped with the shift registers in the second group by a set of MUX gates attached between the set of XOR gates and the six shift registers. As a result, each scan chain receives test data from different sequential elements depending on a state in the control bit.

In some embodiments, a triplet of the two or more shift registers comprising a first, second and third shift registers form a cluster, wherein each of the set of scan chains coupled to a pair of sequential elements in the first and second shift registers is coupled to at most one sequential element in the third shift register, and wherein the first, second and third shift registers of the cluster are different shift registers.

In some embodiments, test data supplied by a tester is divided into at least a set of dynamic variables having a scope of at most N (N≥2) shift cycles and a set of static variables having scope of at least N+1 shift cycles such that an encoding process for calculating decompressed test stimulus shifted into the set of scan chains is decomposed into at least two independent encoding processes associated with the dynamic and static variables wherein the dynamic and static variables have no intersection.

In some embodiments, test data supplied by a tester includes data variables and at least one control variable such that a state of the at least one control variable specifies a first and second sets of the data variables required for calculating decompressed test stimulus shifted into a scan chain of the set of scan chains, wherein the first and second sets of the data variables have at least one unique variable not included in the second and first sets of the data variables, respectively.

BRIEF DESCRIPTION OF THE FIGURES

The patent or application file contains at least one drawing executed in color. Copies of this patent or patent application publication with color drawing(s) will be provided by the Office upon request and payment of the necessary fee.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Overview

Some embodiments of the present invention feature a class of decompressor designs, referred to as "circular decompressors," which can provide both high encoding efficiency and high flexibility for the tester to supply test data bits by selective partial reseeding. The decompressor designs also facilitate an efficient implication process which is capable of dynamically avoiding and handling encoding conflicts due to a dependency in a decompressor scheme.

Decompressor Design Based on Multiple Circular Shift Registers

Figure 1:
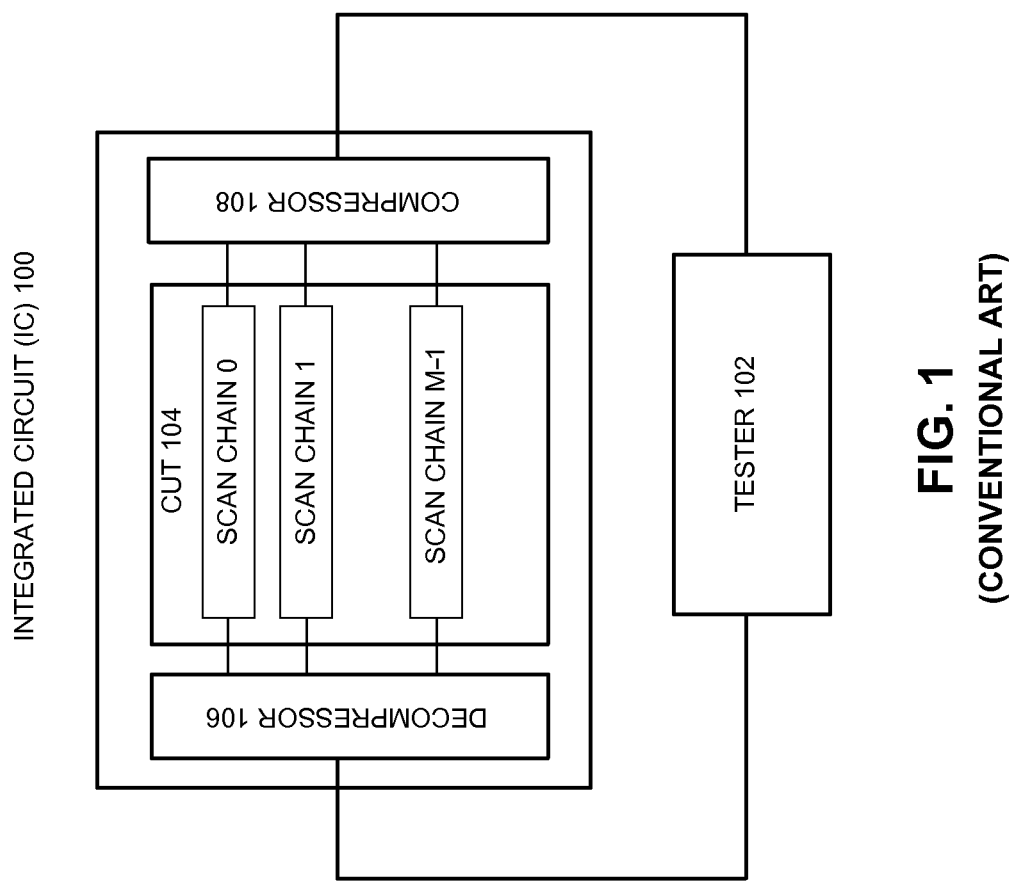
FIG. 1 presents a block diagram illustrating an IC 100 having an on-chip test compression capability.
Figure 2:
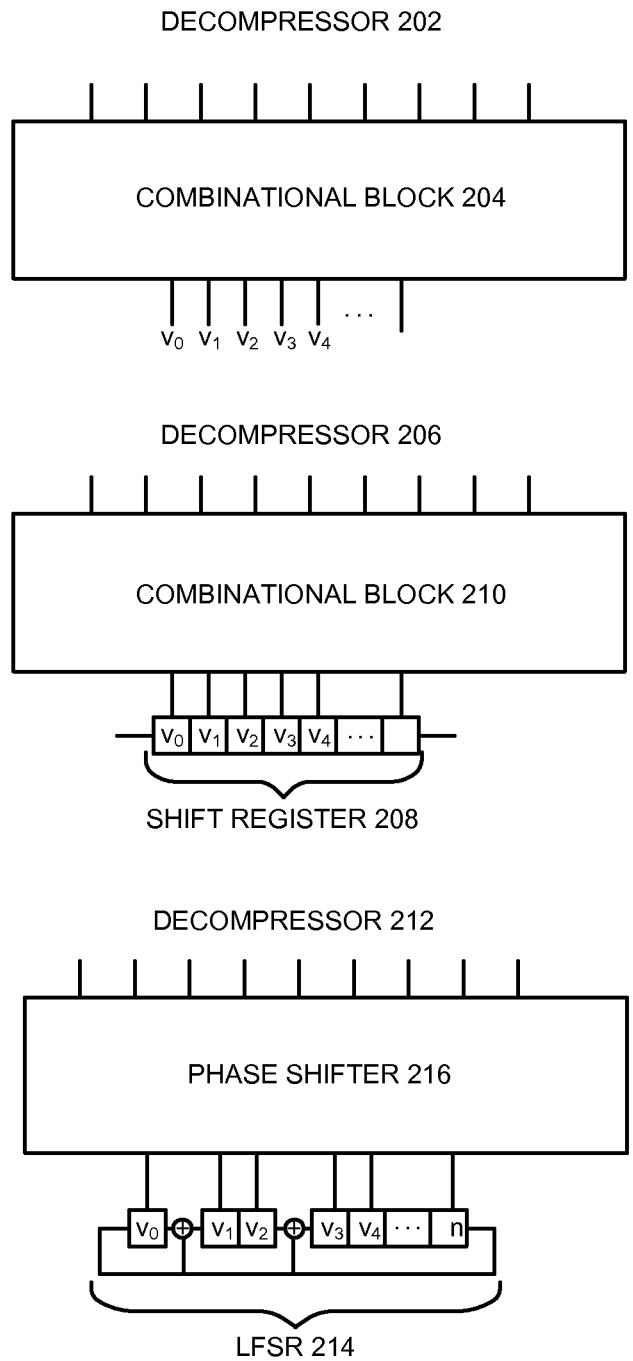
FIG. 2 illustrates a number of conventional decompressor schemes.
Figure 3:
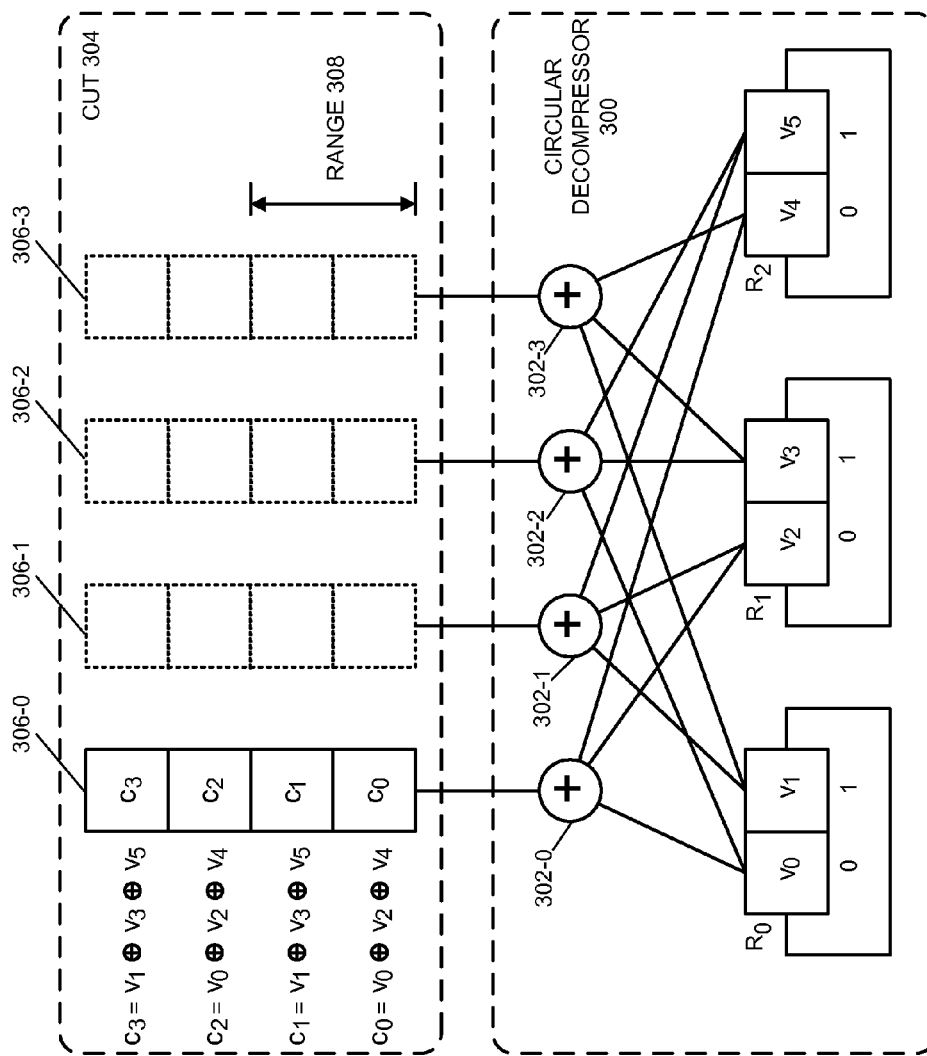
FIG. 3 illustrates an exemplary circular decompressor in accordance with an embodiment of the present invention.

FIG. 3 illustrates an exemplary circular decompressor 300 in accordance with an embodiment of the present invention. As illustrated in FIG. 3, circular decompressor 300 comprises three shift registers $R_0$, $R_1$ and $R_2$ of length two. Moreover, each shift register is configured as a circular shift register such that each sequential element in each shift register receives test data from exactly one predecessor (sequential element) and supplies test data to exactly one successor (sequential element). Note, however, that other embodiments can use greater or fewer than three shift registers and/or greater or fewer than two sequential elements in each shift registers. In another embodiment, only a subset of shift registers in decompressor 300 is configured as circular registers.

Circular decompressor 300 additionally includes a set of four XOR gates 302-0 to 302-3 coupled between the shift registers and a set of four scan chains 306-0 to 306-3, all four scan cells in length, in a CUT 304. In particular, each scan chain 306 receives decompressed test data from a unique XOR gate 302 in the set of XOR gates. Note that other embodiments can use greater or fewer than four scan chains and/or greater or fewer than four scan cells in each scan chain.

For simplicity, let's assume that the shift registers in decompressor 300 shift compressed test data and the scan chains 306 shift decompressed test data with the same speed. As a result, each shift register defines a unique two-group partition of scan chains 306 such that each sequential element in each shift register can be associated with a group of the corresponding partition. For example, shift register $R_0$ defines partitions (306-0, 306-2) corresponding to the sequential element 0 in $R_0$ and partitions (306-1, 306-3) corresponding to sequential element 1 in $R_0$. Similarly, shift register $R_1$ defines partitions (306-0, 306-1) corresponding to sequential element 0 in $R_1$ and partitions (306-2, 306-3) corresponding to sequential element 1 in $R_1$. Consequently, each scan cell in each scan chain is related to three different groups from the three different partitions defined by shift registers $R_0$, $R_1$ and $R_2$. In the embodiment shown, the sequential elements of the shift registers are associated with six input variables $\{v_0, v_1, \ldots, v_5\}$, wherein each variable corresponds to one test data bit. Based on the above-described grouping and partitioning, a characteristic equation of each scan cell can be conveniently derived as an XOR operation of three variables associated with the three groups from the three partitions defined by shift registers $R_0$, $R_1$ and $R_2$. For example, the characteristic equations for scan cells $c_0$, $c_1$, $c_2$ and $c_3$ of the leftmost scan chain 306-0 are shown in FIG. 3. Note that characteristic equations can be represented by a binary matrix having values 0 and 1 based on whether the corresponding variable is or is not present in the characteristic equation.

Moreover, the decompressed test stimulus can be computed based on initial states of all variables $\{v_0, v_1, \ldots, v_5\}$ specified by a seed. Typically, it is assumed that the set of care bits in a test cube is specified during the ATPG, wherein the test cube can be represented by a system of linear equations. As described previously, the test cube is encodable if the corresponding system of linear equations has a solution. Note that the encoding efficiency of the decompressor design can be affected by the presence of linearly dependent scan cells in the set of scan chains. For example, an encoding conflict occurs when a set of linearly dependent scan cells contains an odd number of 1's. Hence, decreasing the number of linearly dependent scan cells often can greatly improve the encoding efficiency of a decompressor design. In one embodiment, a decompressor "range," such as range 308 illustrated in FIG. 3, is used to define a minimum number of consecutive shift cycles during which every pair of scan cells is linearly independent.

More specifically, a set of scan cells is regarded as linearly dependent if a superposition of the corresponding characteristic equations equals 0. This condition can occur if all variables appear even times in the corresponding characteristic equations. In the example of FIG. 3, range 308 of circular decompressor 300 equals two, and a pair of scan cells in a given scan chain separated by exactly one scan cell have the same characteristic equations. The number of scan cells within decompressor range 308 equals $N^3$ (N=2), which is the product of the lengths of all three shift registers. Note that for the exemplary decompressor 300, any four scan cells in one shift cycle are linearly independent. Also, any three scan cells in the decompressor range are linearly independent.

In one embodiment, the procedure (Procedure 1) for synthesizing a circular decompressor associated with $N^2$ scan chains includes the following steps:

1) assign a unique 2-tuple (x, y) to each scan chain where x=(0, 1, ..., N−1) and y=(0, 1, ..., N−1);
2) add three shift registers $R_0$, $R_1$ and $R_2$ of length N;
3) for each of the shift registers, assign values 0, 1, ..., N−1 to each sequential element starting from left to right; and
4) couple scan chain (x, y) to sequential elements a, b and c in shift registers $R_0$, $R_1$ and $R_2$, respectively, wherein a=x, b=y and c=(x+y) mod N.

Note that Procedure 1 can be used to establish the illustrated coupling between the set of scan chains 306 and the set of shift registers $R_0$, $R_1$ and $R_2$.

Figure 4:
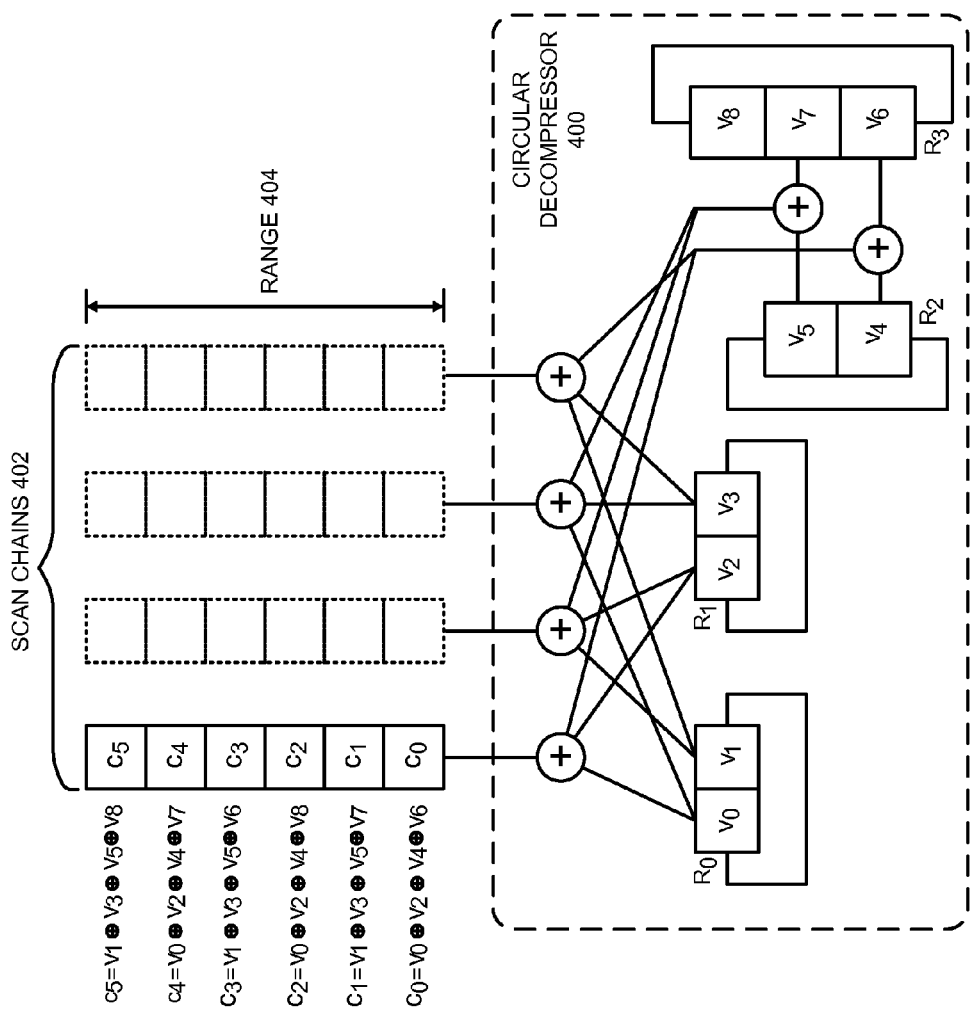
FIG. 4 illustrates an exemplary circular decompressor having three shift registers $R_0$, $R_1$, $R_2$ of length N and one shift register $R_3$ of length M (M and N are relative prime) in accordance with an embodiment of the present invention.

FIG. 4 illustrates an exemplary circular decompressor 400 having three circular shift registers $R_0$, $R_1$, $R_2$ of length N and one circular shift register $R_3$ of length M (M and N are relative prime) in accordance with an embodiment of the present invention. Note that the $N^2$ scan chains 402 are coupled to circular shift registers $R_0$, $R_1$ and $R_2$ in a manner such that each of the sequential elements in the three circular shift registers $R_0$, $R_1$, $R_2$ is coupled to a unique group of scan chains in scan chains 402. In other words, no two sequential elements in registers $R_0$, $R_1$, $R_2$ are coupled to the same group of scan chains. This property can be achieved by synthesizing registers $R_0$, $R_1$, $R_2$ based on Procedure 1.

In one embodiment, the fourth circular shift register $R_3$ in circular decompressor 400 can be coupled to the set of scan chains 402 by first XORing with any one of registers $R_0$, $R_1$ and $R_2$. For example, the example of FIG. 4 illustrates that register $R_3$ is coupled to scan chains 402 by first XORing with individual sequential elements in registers $R_2$ and $R_3$. As a result, the sequential elements of shift registers $R_2$ and $R_3$ are coupled to same groups of scan chains. Note that shift registers $R_2$ and $R_3$ have relatively prime lengths. In other words, M and N are relative prime with the greatest common divisor between them equal to 1. In this embodiment, the decompressor range 404 is determined by a product of lengths M and N (i.e., 6). Note that while M=3 and N=2 in the example shown, M and N can take on other values as long as they are relatively prime. For example, if M=5 and N=2, the decompressor range 404 becomes 10. As a result, the number of scan cells in the decompressor range 404 equals $MN^3$, i.e., a product of the lengths of all shift registers. Note that in the embodiment of FIG. 4, any four scan cells in one shift cycle are linearly independent. Also, any three scan cells in the decompressor range are linearly independent.

Figure 5:
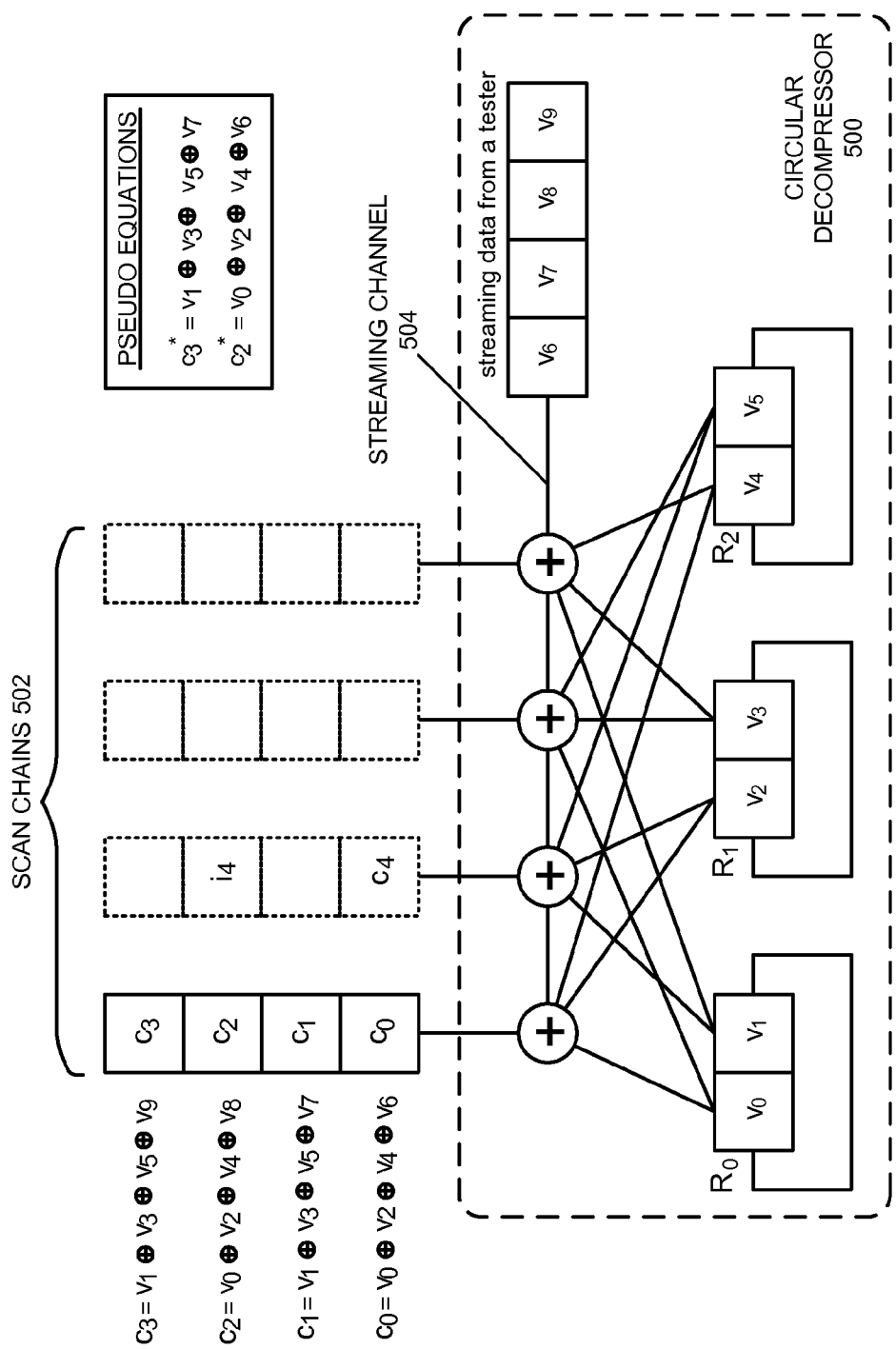
FIG. 5 illustrates an exemplary circular decompressor with dynamic reseeding in accordance with an embodiment of the present invention.

FIG. 5 illustrates an exemplary circular decompressor 500 with dynamic reseeding in accordance with an embodiment of the present invention. Similar to the previously described embodiments, decompressor 500 comprises three shift registers $R_0$, $R_1$ and $R_2$ of length N coupled to $N^2$ scan chains 502, which can also be established based on Procedure 1. Note that decompressor 500 also includes a streaming channel 504 which provides an extra test data bit per shift cycle from the tester to the scan chains 502. In this embodiment, the decompressor range is infinite, and the generated decompressed test stimulus can be viewed as a superposition of a periodic (static) test sequence (shifted in from $R_0$, $R_1$ and $R_2$) and a streaming (dynamic) test sequence comprising one test data bit per shift cycle. Accordingly, during the ATPG, the encoding process of decompressor 500 can be decomposed into a static encoding process and a dynamic encoding process associated with the above-mentioned two test sequences.

More specifically, based on test variables $v_0, v_1, \ldots, v_7$, the static encoding process maps each care bit in a window of P shift cycles using pseudo characteristic equations for scan cells outside this window, wherein P=N is the decompressor range. Pseudo characteristic equations for scan cells $c_2$ and $c_3$ (denoted as $c_2^*$ and $c_3^*$) are shown in the right-hand side of FIG. 5. Furthermore, the static encoding process checks whether the last care bit is encodable, i.e., consistent with all previous care bits. Separately, based on variables $v_8$ and $v_9$, the dynamic encoding process can resolve up to one encoding conflict per shift cycle and derive implications (necessary assignments) based on a condition that for a pair of shift cycles which are equivalent based on modulo P, corresponding pairs of scan cells belonging to each scan chain must be set either to equal or different states. In this manner, the characteristic matrix can be decomposed into two systems of linear equations that may be treated independently.

To illustrate the dynamic encoding process in more detail, let's assume that there are five care bits $c_0, c_1, \ldots, c_4$ to be determined by the test generation process and the last care bit $c_4$ is checked as encodable by the static encoding process. Next, variable $v_8$ is set to either 0 or 1 if care bits $c_0$ and $c_2$ have equal or different states, respectively. Moreover, variable $v_9$ is set to either 0 or 1 if care bits $c_1$ and $c_3$ have equal or different states, respectively. These preconditions imply that the state of scan cell $i_4$ equals $c_4 \oplus v_8$ in order to satisfy equation $c_0 \oplus c_2 \oplus c_4 \oplus i_4 = 0$, because scan cells $c_0, c_2, c_4$ and $i_4$ belong to a pair of scan chains in shift cycles which are equivalent based on modulo P. The described embodiment provides a mechanism for deriving most of the necessary assignments based on dependencies introduced by the decompressor design of FIG. 5, thus improving the efficiency of the implication process and the merging process during the ATPG. The same technique can be extended to a decompressor circuit having two or more streaming channels and to other decompressor designs involving dynamic reseeding.

Figure 6:
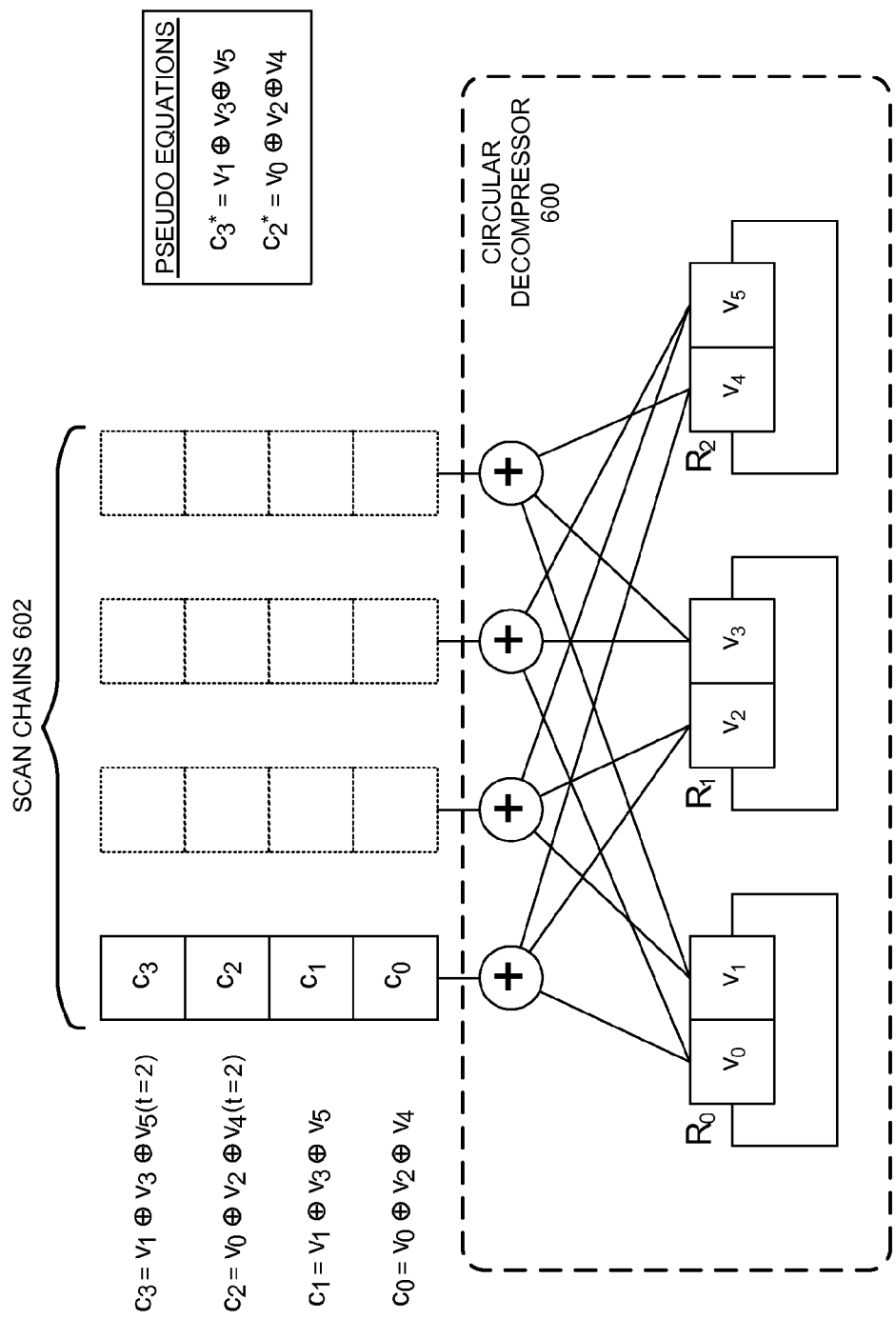
FIG. 6 illustrates an exemplary circular decompressor with dynamic partial reseeding in accordance with an embodiment of the present invention.

FIG. 6 illustrates an exemplary circular decompressor 600 with dynamic partial reseeding in accordance with an embodiment of the present invention. Again, the illustrated decompressor 600 comprises three shift registers $R_0$, $R_1$ and $R_2$ of length N coupled to $N^2$ scan chains 602 based on Procedure 1. In this embodiment, the dynamic partial reseeding is achieved by reseeding register $R_2$ every N shift cycles. To reflect this modification, a parameter t is added to variables $v_4(t)$ and $v_5(t)$ where t is a positive integer equal to 0, N, 2N, . . . . Note that this embodiment provides higher flexibility than the above-described streaming channel techniques because: 1) each streaming test data bit in the streaming channel is dedicated to a specific shift cycle, while in the dynamic partial reseeding, each test data bit has an impact on multiple shift cycles; and 2) the amount of streaming test data bits is fixed by the number of streaming channels, while the dynamic partial reseeding in FIG. 6 may be enhanced to allow a selective partial reseeding for one or more shift registers as needed.

Figure 7:
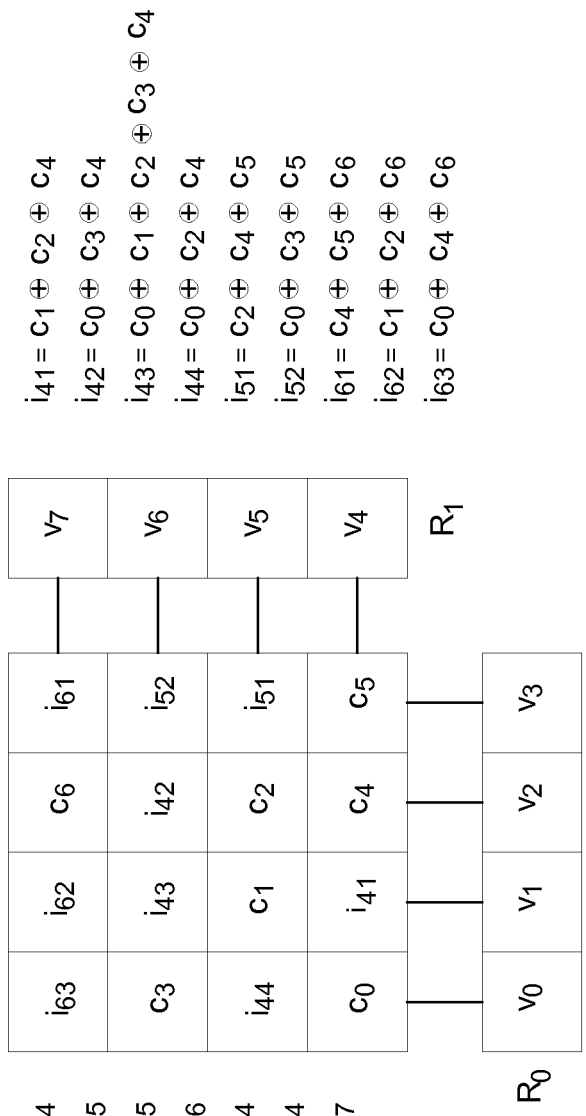
FIG. 7 illustrates a dynamic encoding for a circular decompressor constructed according to a proposed procedure when two pre-selected shift registers $R_0$ and $R_1$ are reseeded every N (N=4) shift cycles in accordance with an embodiment of the present invention.

FIG. 7 illustrates a dynamic encoding of a circular decompressor constructed according to Procedure 1 when two preselected shift registers $R_0$ and $R_1$ are reseeded every N (N=4) shift cycles in accordance with an embodiment of the present invention. As is illustrated in FIG. 7, two mutually orthogonal partitions of scan chains defined by registers $R_0$ and $R_1$ divide scan cells into $N^2$ equivalent classes such that N equivalent scan cells belong to the same group in both partitions. During the ATPG, a set of variables $v_0, v_1, \ldots, v_{2N-1}$ is assigned to the sequential elements of both shift registers. A set of care bits $c_0, c_1, \ldots, c_6$ is shown in FIG. 7 wherein the index of each care bit determines an order for these care bits. The characteristic equations of the first four care bits which are valid for all equivalent scan cells are shown in FIG. 7. Accordingly, each care bit implies that all equivalent scan cells contain the same in the dynamic test sequence.

In the embodiment of FIG. 7, four scan cells located at the intersections of a pair of rows with a pair of columns (referred to as a "quadruple") are linearly dependent because each one of the corresponding four variables appears twice in the characteristic equations of the quadruple scan cells. To avoid encoding conflict, any quadruplet of linearly dependent scan cells must contain an even number of 1's. Next, implications derived from care bits $c_a$ are marked as $i_{ab}$ for each a=0, 1, . . . , 6. These implications are derived based on the above condition. In other words, the states in any three care bits of a quadruplet determine the state in the fourth scan cell such that the four scan cells should contain an even number of 1's. As is illustrated in FIG. 7, implications are likely to exist after the first N care bits. Furthermore, each care bit implies the states of N equivalent scan cells in the dynamic test sequence, but the probability that a pair of scan cells is equivalent rapidly decreases for a large N. Under the assumption that a small set of scan cells is involved in the test generation process, for a target fault the impact of the dynamic implications to avoid encoding conflicts is likely to be moderate. Similarly, the presented approach may be extended for deriving implications between more than two mutually orthogonal partitions.

Figure 8:
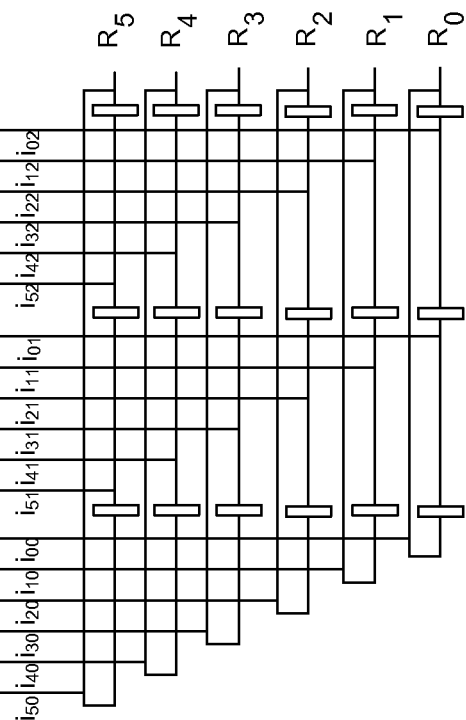
FIG. 8 presents a block diagram of an augmented circular decompressor (N, K, V) in accordance with an embodiment of the present invention.

FIG. 8 presents a block diagram of an augmented circular decompressor (ACD)(N, K, V) 800 in accordance with an embodiment of the present invention. In this embodiment, N=3 is the number of groups of scan chains in one partition, K=6 is the number of mutually orthogonal partitions, and V=6 is the number of shift registers $R_0, R_1, R_2, \ldots, R_{v-1}$. ACD(N, K, V) 800 includes a set of shift registers and a linear network 802 constructed based on K mutually orthogonal partitions specified by the following six formulas: x, [(x+y) mod N], y, [(x+z) mod N], z, [(y+z) mod N]. Linear network 802 is coupled to the set of shift registers $R_0, R_1, R_2, \ldots, R_5$ by sets of wires labeled as $i_{mn}$, wherein m is the index of the register the wire is coupled to and n is the index of the specific sequential element in register $R_m$ the wire is coupled to.

In one embodiment, the procedure (Procedure 2) for synthesizing a circular decompressor may include the following steps:
1) assign a unique triplet to each scan chain (x, y, z) where x, y, z={0, 1, 2, . . . , N−1};
2) assign a unique index {0, 1, 2, . . . , N−1} to each sequential element in each shift register based on its position in the corresponding shift register;
3) assign a unique formula (a partition) to shift register $R_i$ for i=0, 1, . . . , 5; and
4) couple each scan chain (x, y, z) to one sequential element in each shift register such that the value of the corresponding formula determines the index of the sequential element.

Note that the above decompressor synthesis procedure creates a linear network 802 between a set of scan chains (not shown) and the set of shift registers, wherein linear network 802 has $N^3$ outputs and KN inputs such that the inputs are divided into groups of N inputs $\{I_0, I_1, \ldots, I_{K-1}\}$ associated with shift registers $\{R_0, R_1, \ldots, R_{K-1}\}$ of length N, respectively. A decompressor range of an ACD(N, K, V) is N shift cycles, and any three scan cells are linearly independent within the decompressor range when K≥4. In one embodiment, at least four mutually orthogonal partitions, for example, {x, y, (x+y) mod N, z}, are required to construct an ACD in order to satisfy this condition. For N is an odd number and K=6, any four scan cells in one shift cycle are linearly independent.

Figure 9:
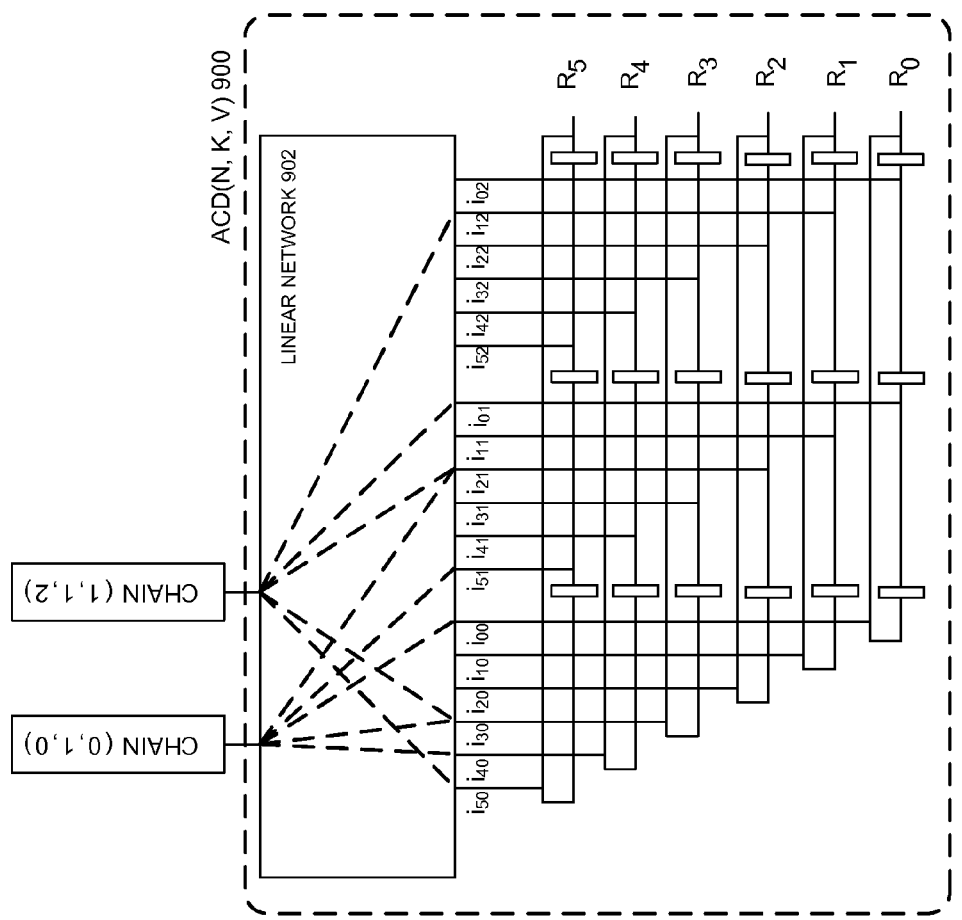
FIG. 9 presents a block diagram of a modified ACD(N, K, V) in accordance with an embodiment of the present invention.

FIG. 9 presents a block diagram of a modified ACD(N, K, V) 900 in accordance with an embodiment of the present invention. In this embodiment, N=3 is the number of groups of scan chains in one partition, K=6 is the number of mutually orthogonal partitions, and V=6 is the number of shift registers. However, the modified ACD(N, K, V) 900 includes a set of shift registers and a linear network constructed based on 7 mutually orthogonal partitions specified by the following formulas: x, [(x+y) mod N], y, [(x+z) mod N], z, [(y+z) mod N], [(x+y+z) mod N]. In one embodiment, the procedure (Procedure 3) for synthesizing a circular decompressor may include the following steps:
1) assign a unique triplet (x, y, z) to each scan chain, wherein x, y, z={0, 1, 2, . . . , N−1};
2) assign a unique index {0, 1, 2, . . . , N−1} to each sequential element based on its position in the corresponding shift register;
3) assign a unique formula: x, [(x+y) mod N], y, [(x+z) mod N], z, [(y+z) mod N] to shift register $R_i$ (i=0, 1, . . . , 5), respectively;
4) couple each scan chain (x, y, z) to one sequential element in each shift register such that the value of the corresponding formula determines the index of the sequential element; and
5) decouple scan chain (x, y, z) from shift register $R_i$ where i=(x+y+z) mod G and G is the larger of {N, K}.

For example, the resulting connections determined by the synthesis procedure 3 are illustrated for scan chain (0, 1, 0) and scan chain (1, 1, 2) in FIG. 9 as a linear network 902. Note that for the modified ACD(N, K, 6), any three scan cells in the decompressor range are linearly independent when N≥2 and K≥4. Moreover, for N is odd and K=6, any four scan cells in one shift cycle are linearly independent. The above-described decompressor design technique provides a significant reduction in linear dependency between four and more scan cells in the decompressor range.

Figure 10:
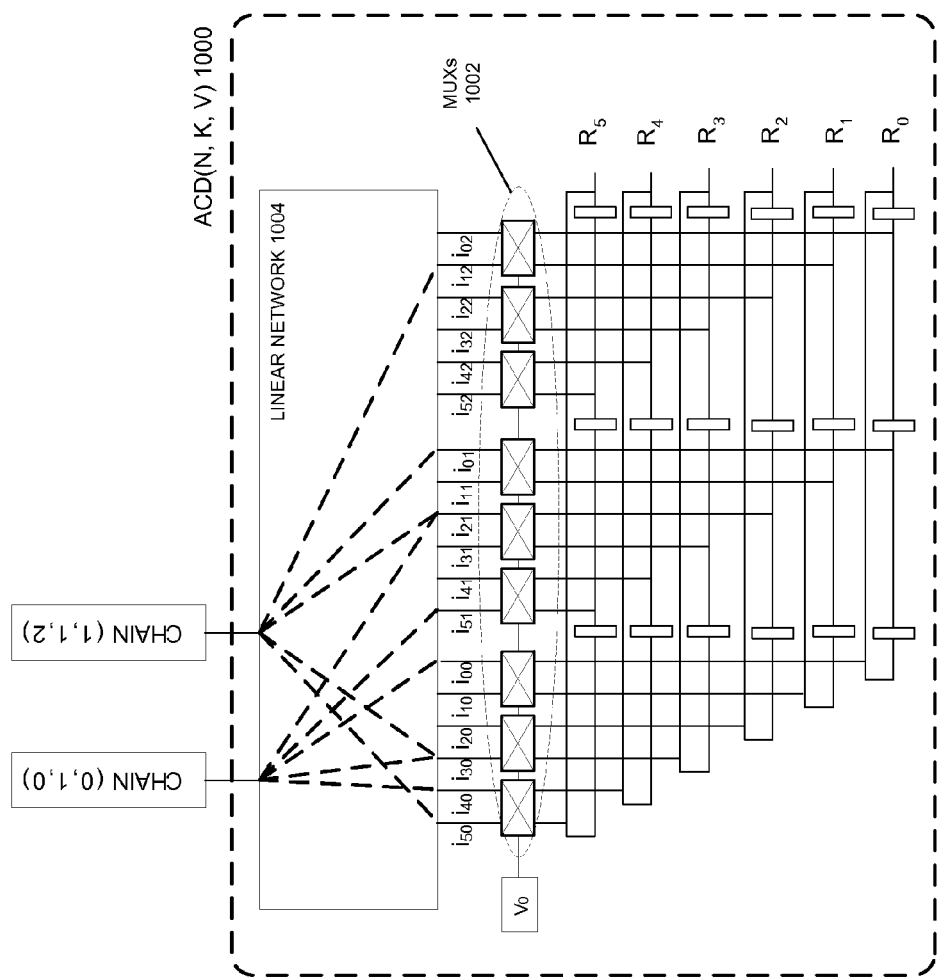
FIG. 10 presents a block diagram of an enhanced ACD(N, K, V) in accordance with an embodiment of the present invention.

FIG. 10 presents a block diagram of an enhanced ACD(N, K, V) 1000 in accordance with an embodiment of the present invention. Again, N=3 is the number of groups of scan chains in one partition, K=6 is the number of mutually orthogonal partitions, and V=6 is the number of shift. As illustrated in FIG. 10, the enhanced ACD(N, K, V) 1000 is constructed based on the modified ACD(N, K, V) 900 by adding a set of MUXs 1002 for swapping shift registers $R_0$ with $R_1$, $R_2$ with $R_3$, and $R_4$ with $R_5$ before coupling them to linear network 1004. Note that the swapping operation is controlled by an extra variable $v_0$. More specifically, when $v_0$=0, the groups of inputs $I_0, I_1, \ldots, I_5$ of linear network 1004 receive test data from shift registers $R_0, R_1, R_2, R_3, R_4, R_5$, respectively. When $v_0$=1, the groups of inputs $I_0, I_1, \ldots, I_5$ of linear network 1004 receive test data from shift registers $R_1, R_0, R_3, R_2, R_5, R_4$, respectively.

For N is odd, N≥5, and K=6, the enhanced ACD(N, K, V) 1000 guarantees that any four scan cells within the decompressor range are linearly independent when $v_0$ is either 0 or 1. Moreover, the set of shift registers can be divided into two groups $\{R_0, R_2, R_4\}$ and $\{R_1, R_3, R_5\}$ such that the first group of shift registers is associated with three partitions defined by three formulas {x, y, z} and the second group of shift registers is associated with three partitions defined by three formulas {[(x+y) mod N], [(x+z) mod N], [(y+z) mod N]}. Any combination of three swapping pairs between the first group and the second group of shift registers guarantees that any four scan cells within the decompressor range are linearly independent either with or without a swapping operation. In other words, an intersection of linearly dependent quadruplets of scan cells with and without swapping is empty. To support the decompressor design in FIG. 10, the static encoding process assigns variables $v_1, v_2, \ldots, v_{nk}$ to sequential elements in the shift registers $R_0, R_1, \ldots, R_5$. Consequently, two systems of linear equations can be derived and processed to reflect the presence and absence of a swapping operation during the ATPG, respectively. The state of variable $v_0$ is determined based on the first encoding conflict. This feature allows further improvement in the encoding efficiency of the decompressor scheme. An advanced decompressor scheme based on this feature may include independent control of a set of MUX's for swapping a pair of shift registers as well as per shift cycle control for swapping operation. More specifically, the advanced decompressor scheme may include a 3-bit counter such that each bit of the 3-bit counter controls swapping operation of one of the three pairs of shift registers. An initial state of the 3-bit counter is determined by the state of variable $v_0$ and the state of the 3-bit counter is increased for each shift cycle.

Figure 11:
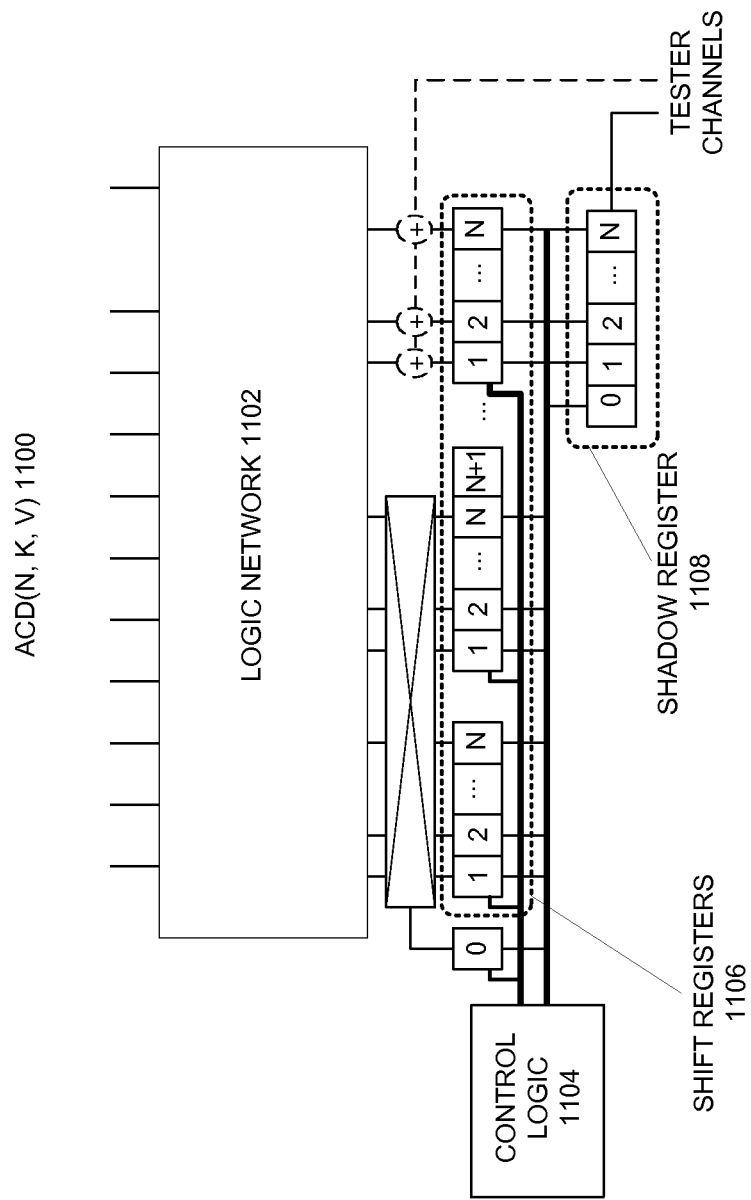
FIG. 11 presents a block diagram of an ACD(N, K, V) which allows selective partial reseeding in accordance with an embodiment of the present invention.

FIG. 11 presents a block diagram of an ACD(N, K, V) 1100 which allows selective partial reseeding in accordance with an embodiment of the present invention. As illustrated in FIG. 11, the ACD 1100 comprises a logic network 1102, control logic 1104, and a set of V reconfigurable shift registers 1106 of length that is at least N and having a single feedback loop such that reconfigurable shift registers 1106 selectively receive test data as needed from a shadow register 1108 of length N+1. The purpose of shadow register 1108 is to decouple shifting test data in the scan chains and the reconfigurable shift registers. Consequently, the present embodiment allows shifting compressed test data in shadow register 1108 with a different (usually higher) speed while shifting decompressed test data in the scan chains.

Additionally, ACD(N, K, V) 1100 may have one or more streaming tester channels wherein each one of such channels provides one test data bit per shift cycle. As a result, the decompressor design in FIG. 11 provides three mechanisms for supplying test data bits from a tester: (1) all reconfigurable shift registers can be reseeded in one shift cycle; (2) one or more reconfigurable shift registers can be selectively reseeded as needed; and (3) one test data bit for each streaming channel per shift cycle. Note that mechanisms (1) and (2) provide similar flexibility under the assumption that 0 or all reconfigurable shift registers can be reseeded in one shift cycle. Meanwhile, mechanisms (2) and (3) have similar flexibility under the assumption that S reconfigurable shift registers are reseeded after each N shift cycles where S is the number of streaming channels. While mechanisms (1) and (3) have similar flexibility as mechanism 2 under certain restrictions, mechanism (2) typically provides the highest flexibility among the three mechanisms for supplying test data from a tester.

Figure 12:
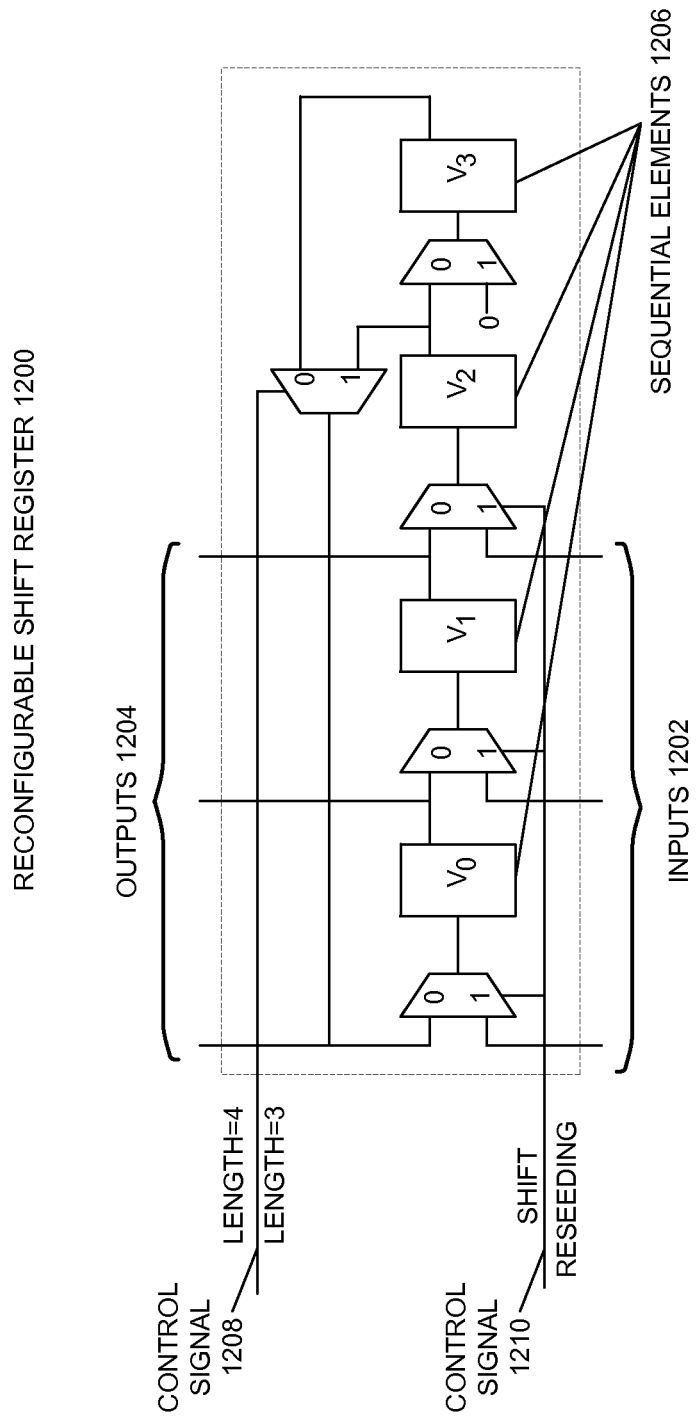
FIG. 12 illustrates an exemplary reconfigurable shift register for N=3 in accordance with an embodiment of the present invention.

FIG. 12 illustrates an exemplary reconfigurable shift register 1200 for N=3 in accordance with an embodiment of the present invention. As illustrated in FIG. 12, reconfigurable shift register 1200 includes: N parallel inputs 1202, N parallel outputs 1204, (N+1) sequential elements 1206, and two control signals 1208 and 1210. Control signal 1208 determines that the length of reconfigurable shift register 1200 is either N or N+1. Control signal 1210 determines which operation, either shifting or reseeding, is selected. During a reseeding operation, the states in the parallel inputs 1202 are stored in the first N sequential elements, and state 0 is stored in the last sequential element after each clock pulse. During a shifting operation, the state in the previous sequential element is stored in each sequential element after each clock pulse wherein the previous sequential element of the first sequential element depends on values of control signal 1208.

Assume that all shift registers have the same length N and a single feedback. Also assume that all shift registers shift compressed test data and scan chains shift the decompressed test stimulus with the same speed. As a result, the decompressor range is N and the generated test sequence is repeated after N shift cycles under the assumption that all shift registers are reloaded once per pattern. The decompressor range may be increased using one of the following approaches: 1) at least one shift register is reconfigured to selectively change its length to N and $N_1$, wherein N and $N_1$ are relative prime; 2) at least one shift register can be selectively reseeded; 3) at least one pair of shift registers supports the swapping operation discussed in conjunction with FIG. 10; 4) at least one shift register is reconfigured to selectively change an order of sequential elements; 5) at least one shift register is reconfigured to selectively change the shifting speed with respect to the shifting speed of scan chains; and 6) two or more shift registers are reconfigured to form a single shift register having at least one feedback loop. Consequently, a set of decompressor commands may include the following instructions for one or more reconfigurable shift registers: 1) disable/enable reload operation; 2) disable/enable changing length (the number of sequential elements); 3) disable/enable reseeding operation; 4) disabled/enable swapping operation; 5) disabled/enable shifting operation; and 6) disable/enable changing an order of sequential elements.

Performance Analysis of an ACD(N, K, V)

Figure 13:
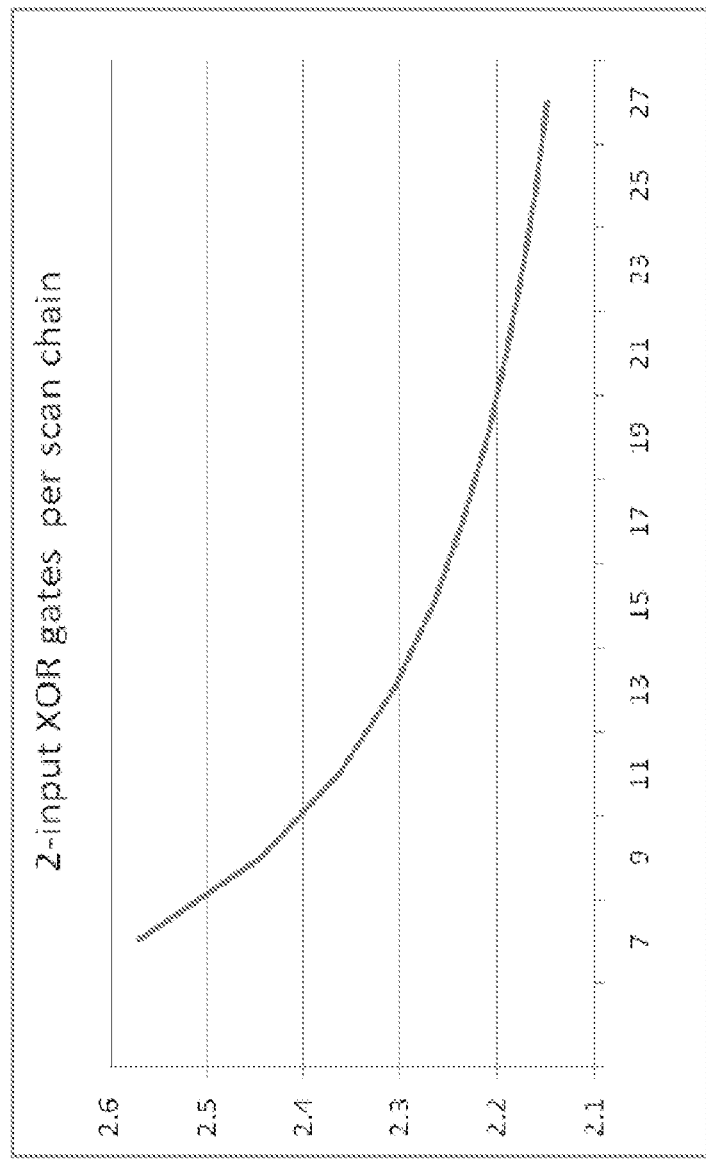
FIG. 13 illustrates an estimated hardware overhead of the modified ACD(N, K, V) based on the number of required 2-input XOR gates in the logic network per scan chain in accordance with an embodiment of the present invention.

FIG. 13 illustrates an estimated hardware overhead of the modified ACD(N, K, V) (e.g., ACD(N, K, V) 900 in FIG. 9) based on the number of required 2-input XOR gates in the linear network per scan chain in accordance with an embodiment of the present invention. As is illustrated in FIG. 13, the hardware overhead in the linear network can be minimized by clustering, i.e., connecting each XOR gates of a cluster to different scan chains. For the linear network 802, the mutually orthogonal partitions defined by the following formulas: x, y, [(x+y) mod N] define a cluster of $N^2$ XOR gates such that each XOR gate is coupled to N scan chains having fixed values for parameters x and y while parameter z changes from $0, 1, \ldots, N-1$. As a result, a triplet of shift registers (A, B, C) forms a cluster of $N^2$ XOR gates such that each XOR gate of this cluster is coupled to one sequential element of shift registers A, B and C.

More specifically, let a, b and c be sequential elements belonging to shift registers A, B and C associated with formulas x, y, [(x+y) mod N], respectively. The XOR gate (a, b) of cluster (x, y, x+y) is coupled to the following N scan chains: $\{(a, b, 0), (a, b, 1), (a, b, 2), \ldots, (a, b, N-1)\}$. Accordingly, $2N^2$ 2-input XOR gates are required to implement this cluster in the linear network 802. For the linear network 902, a scan chain (x, y, z) is disconnected from at most one shift register A, B or C. As a result, the set of scan chains $\{(a, b, 0), (a, b, 1), (a, b, 2), \ldots, (a, b, N-1)\}$ may be also connected to clusters (x, y), (x, x+y) and (y, x+y) defined by 2 mutually orthogonal partitions and the respective sets of $N^2$ 2-input XOR gates are coupled to at least 2 sequential elements of shift registers A, B and C. Accordingly, $4N^2$ 2-input XOR gates are required to implement clusters (x, y, x+y), (x, y), (x, x+y) and (y, x+y) for the linear network 902. In addition, $N^2$ 2-input XOR gates are required to implement cluster (z, x+z). The remaining formula [(y+z) mod N] can be treated independently. As a result, each scan chain is coupled to at most 2 clusters and at most one independent shift register which is associated with formula [(y+z) mod N]. Therefore, at most $2N^3$ 2-input XOR gates are required to implement this part of the linear network 902. Accordingly, an upper bound for the hardware overhead of the linear networks 902 can be estimated using the following formula: $2N^3+5N^2$. Also, the hardware overhead of the linear networks 802 can be computed using the following formula: $2N^3+3N^2$. Note that, for large values of N, the hardware overhead is close to two 2-input XOR gates per scan chain.

For K=5, the hardware overhead in the linear networks 802 and 902 will be $N^3+3N^2$ and $N^3+5N^2$, respectively. Note that, for large values of N, the hardware overhead is close to one 2-input XOR gates per scan chain. An impact on encoding property is expected to be negligible since any three scan cells in the decompressor range of the ACD(N, K, V) will still be linearly independent. For K=4, the hardware overhead in the linear networks 802 and 902 will be $N^3+2N^2$ and $N^3+4N^2$, respectively. An impact on encoding property is expected to be moderate since any three scan cells in the decompressor range of the ACD(N, K, V) will still be linearly independent. In general, clusters exist between any two mutually orthogonal partitions. Accordingly, a cluster divides scan chains into $N^2$ equivalence classes such that each equivalence class includes scan chains. The number of 2-input XOR gates of a cluster is $2N^2$.

As was previously shown, clusters exist for triplets of mutually orthogonal partitions: $\{x, y, [(x+y) \bmod N]\}$, $\{x, z, [(x+z) \bmod N]\}$, $\{x, [(y+z) \bmod N], [(x+y+z) \bmod N]\}$, ..., $\{z, [(x+y) \bmod N], [(x+y+z) \bmod N]\}$. The remaining triplets of mutually orthogonal partitions form super clusters. Accordingly, a super cluster divides scan chains into $N^3$ equivalence classes such that each equivalence class includes one scan chain. Super clusters are defined by the following mutually orthogonal partitions: $\{x, y, z\}$, $\{x, y, [(x+z) \bmod N]\}$, $\{x, y, [(y+z) \bmod N]\}$, ..., $\{[(x+z) \bmod N], [(y+z) \bmod N], [(x+y+z) \bmod N]\}$. The number of 2-input XOR gates of a super cluster is $2N^3$.

In U.S. Pat. No. 7,584,392, the 3-dementional version of a linear decompressor is based on super clusters for constructing the conventional combinational decompressors. In U.S. Pat. No. 6,874,109, the method for synthesizing phase shifters with reduced linear dependency does not apply a grouping for sequential elements and it is unlikely to produce a linear network comprising clusters. Therefore, the described clustering approach for synthesizing the linear network of the ACD(N, K, V) is both distinctive and advantageous. This approach can be easily adapted for synthesizing phase shifters of the conventional sequential decompressors having a very high encoding efficiency and minimized routing congestion during physical implementation.

More specifically, the following steps can be used for coupling S scan chains to Q sequential elements: 1) divide sequential elements in K+1 groups such that $N^K \leq S$ and $N=\lfloor Q/(K+1) \rfloor$; 2) for each k-tuple $(x_0, x_1, x_2, \ldots, x_{k-1})$, generate a combination of K+1 sequential elements belonging to different groups using at least the following formulas: $x_0, x_1, x_2, \ldots, x_{k-1}, (x_0+x_1) \bmod N$, wherein $x_i=\{0, 1, 2, \ldots, N-1\}$ for $i=\{0, 1, 2, \ldots, K-1\}$; and 3) assign a unique k-tuple $(x_0, x_1, x_2, \ldots, x_{k-1})$ to each scan chain based on a set of criteria including linear dependency between scan cells and channel separation. The resulted linear network will have a minimized number of XOR gates and minimized routing congestion. In this sense, an indication for using a clustering approach may include the following steps: 1) partitioning of sequential elements into K groups such that each scan chain is coupled to at most one sequential element in each group; 2) associating each group with a shift register—an ordered set of at least 2 sequential elements; and 3) classifying triplets of shift registers into at least two categories: triplets forming super clusters and triplets forming clusters wherein the number of combinations of three sequential elements for supper clusters is expected to be significantly higher than the number of combinations of three sequential elements for clusters.

Figure 14:
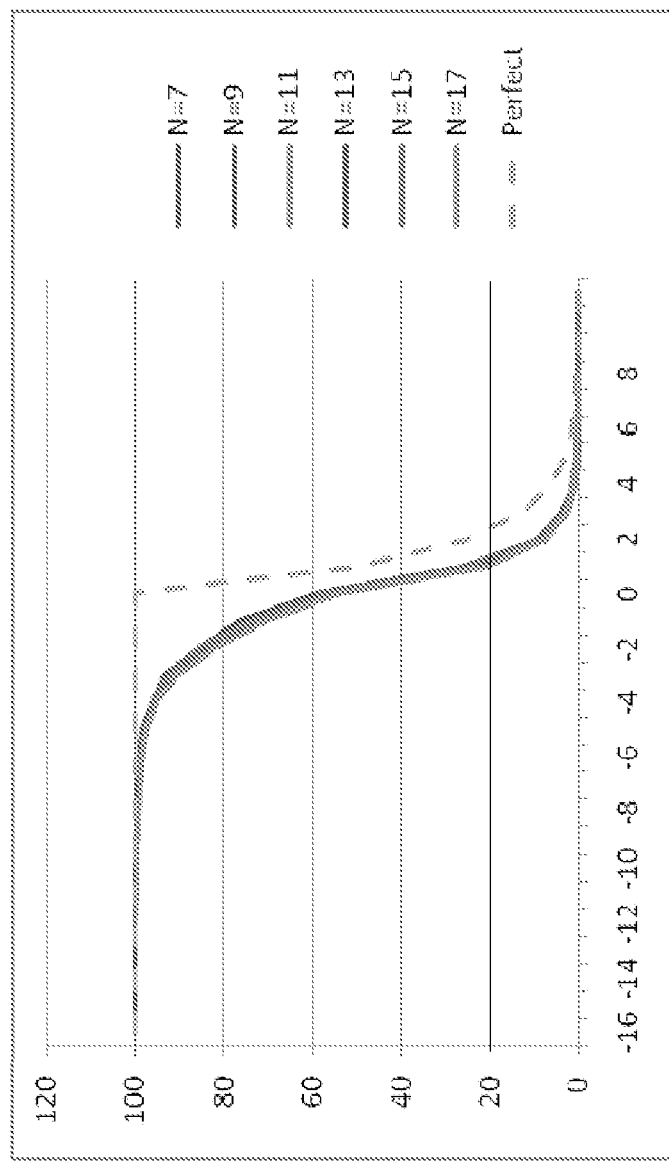
FIG. 14 illustrates an encoding efficiency of the modified ACD(N, 6, 6) within the decompressor range of N shift cycles in accordance with an embodiment of the present invention.

FIG. 14 illustrates an encoding efficiency of the modified ACD(N, 6, 6) within the decompressor range of N shift cycles in accordance with an embodiment of the present invention. Note that the encoding efficiency can be defined as a ratio of successfully encoded specified care bits to the total number of test data bits supplied by a tester. The encoding process can include the following steps: 1) assigning a variable to each test data bit; 2) randomly selecting a care bit (a scan cell and its state); 3) deriving a characteristic equation of the current scan cell based on the variables assigned in step 1; 4) forming a system of linear equations including characteristic equations of all selected care bits; 5) solving the system of linear equations using Gauss-Jordan elimination; and 6) if the system of linear equations has a solution going to step 2, otherwise returning an encoding conflict.

For a perfect decompressor without any linear dependency, the first T care bits can always be encoded when T is the number of test data bits (or variables). After this, the encoding probability becomes $0.5^{Q-T}$ wherein Q is the total number of care bits. For an ACD(N, K, V), the encoding efficiency depends on the presence of linearly dependent scan cells. An encoding conflict exists when an odd number of 1's is assigned to a set of linearly dependent scan cells. The data shown in FIG. 14 demonstrates that the ACD achieves encoding efficiency similar to the encoding efficiency of the perfect decompressor.

Figure 15:
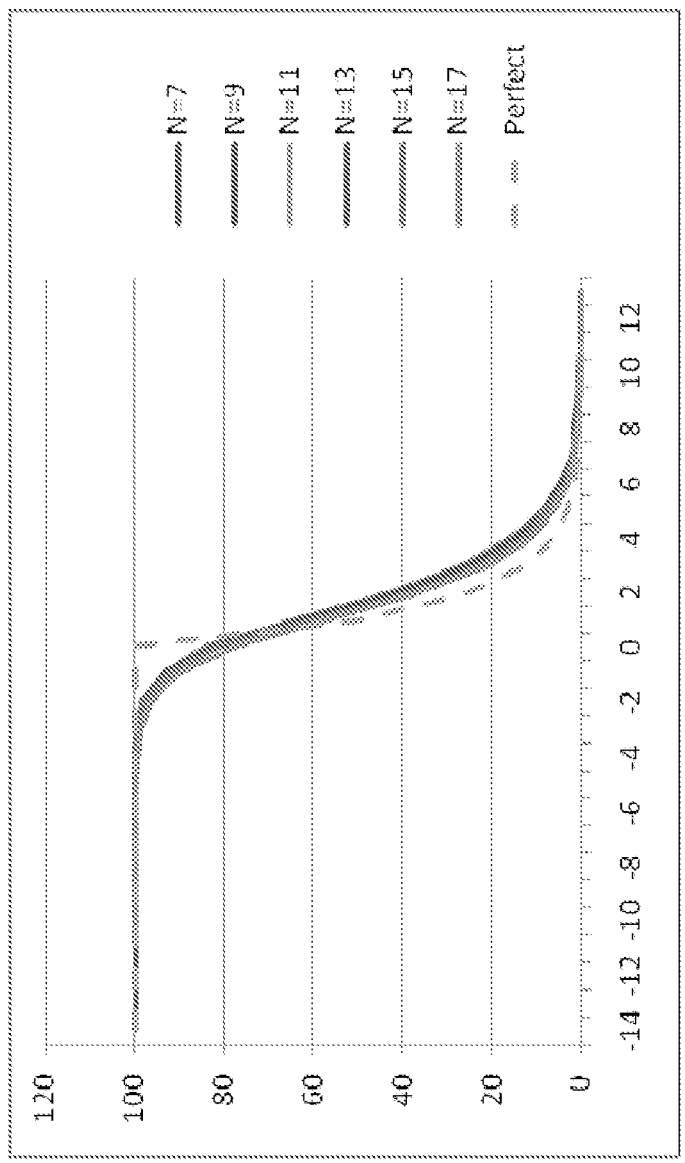
FIG. 15 illustrates an encoding efficiency of the enhanced ACD(N, 6, 6) within the decompressor range of N shift cycles in accordance with an embodiment of the present invention.

FIG. 15 illustrates an encoding efficiency of the enhanced ACD(N, 6, 6) within the decompressor range of N shift cycles in accordance with an embodiment of the present invention. The data shown in FIG. 15 demonstrates that the enhanced ACD has a potential to achieve higher encoding efficiency than the perfect decompressor in certain intervals. The average encoding efficiency of the enhanced ACD was in a narrow range between 99.99-100.80 percent. Moreover, the minimum number of encodable care bits was improved by 2-5 care bits in comparison to the modified ACD illustrated in FIG. 14.

Figure 16:
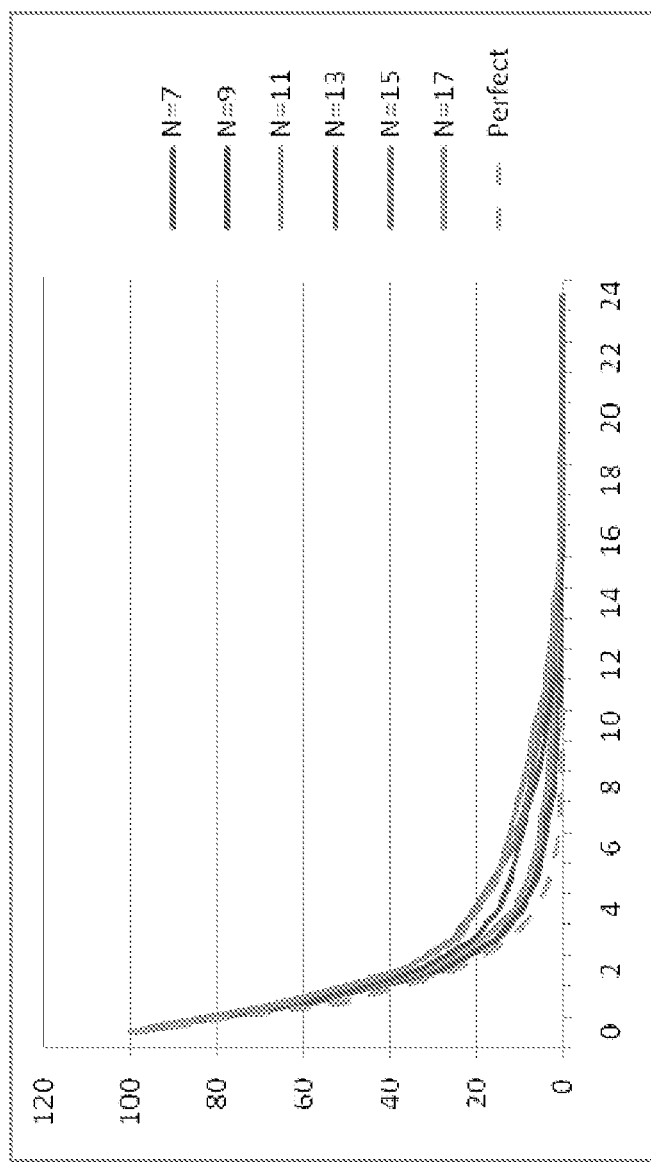
FIG. 16 illustrates an encoding efficiency of the modified ACD(N, 6, 6) within the decompressor range of N shift cycles and having a backtracking limit of 10 in accordance with an embodiment of the present invention.

FIG. 16 illustrates an encoding efficiency of the modified ACD(N, 6, 6) within the decompressor range of N shift cycles and having a backtracking limit of 10 in accordance with an embodiment of the present invention. Generally, test generation involves making decisions to accomplish certain goals. More specifically, each decision may involve one or more state assignments (assigning states to signals) and an implication process that needs to find most of the necessary state assignments as a result of each decision. A conflict may exist because the implication process is typically not capable of finding all necessary state assignments in a reasonable time during the ATPG. Similarly, the static encoding process is executed for each care bit and checks that all specified care bits are encodable. The static encoding process is capable of deriving some necessary assignments due to a dependency of the decompressor, but it is incapable of deriving all necessary assignments. Consequently, an encoding conflict may exist but may be treated like all other conflicts during the ATPG. The simulation results demonstrate that the minimum number of encoded care bits always exceeds the number of supplied test data bits with a small backtracking limit under an assumption that all conflicts during the ATPG are treated in the same way.

Figure 17:
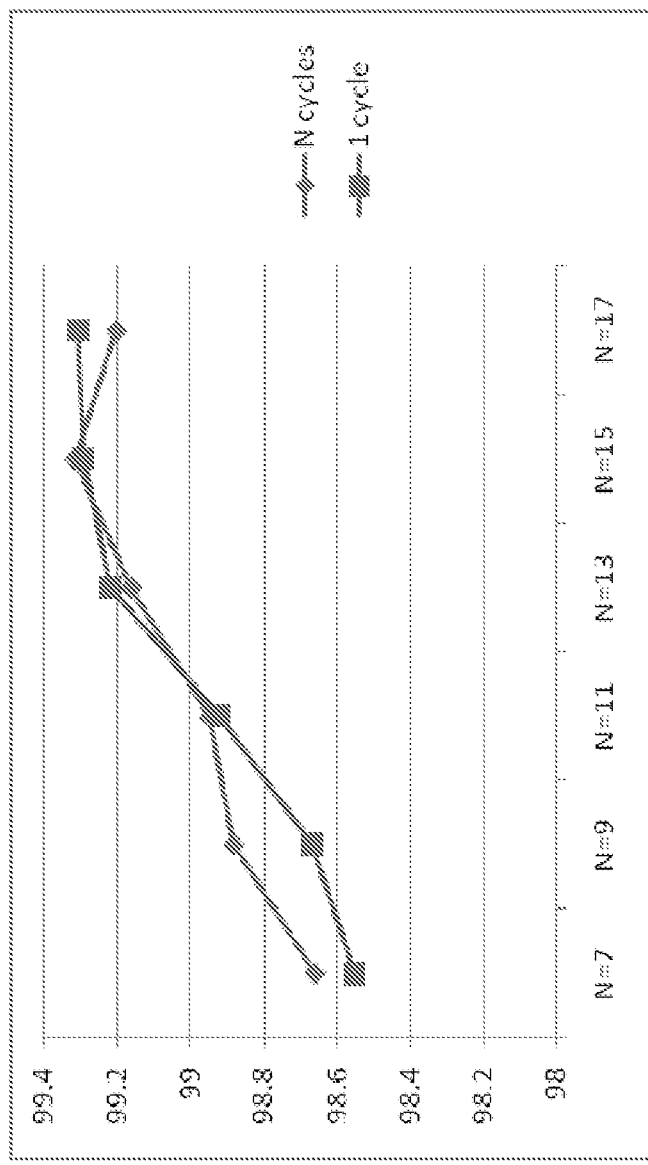
FIG. 17 illustrates a comparison between the average encoding efficiency of the modified ACD(N, 6, 6) in 1 and N shift cycles in accordance with an embodiment of the present invention.

FIG. 17 illustrates a comparison between the average encoding efficiency of the modified ACD(N, 6, 6) in 1 and N shift cycles in accordance with an embodiment of the present invention. Note that an important goal of the compression schemes is to achieve very high compression ratio between the number of scan chains and the size of the decompressor scheme determined by the total length of shift registers. It can be seen that increasing the compression ratio has a positive impact on test application time and switching activities (power dissipation in test mode). However, increasing the compression ratio also increases the number of specified care bits in one shift cycle that may result in an inability of the decompressor scheme to successfully encode all care bits within one shift. Note that none of the discussed advantageous features is useful to resolve this limitation. In this case, achieving a similar encoding efficiency in a single shift cycle and N shift cycles becomes an adventurous feature of the present circular decompressor design.

Figure 18:
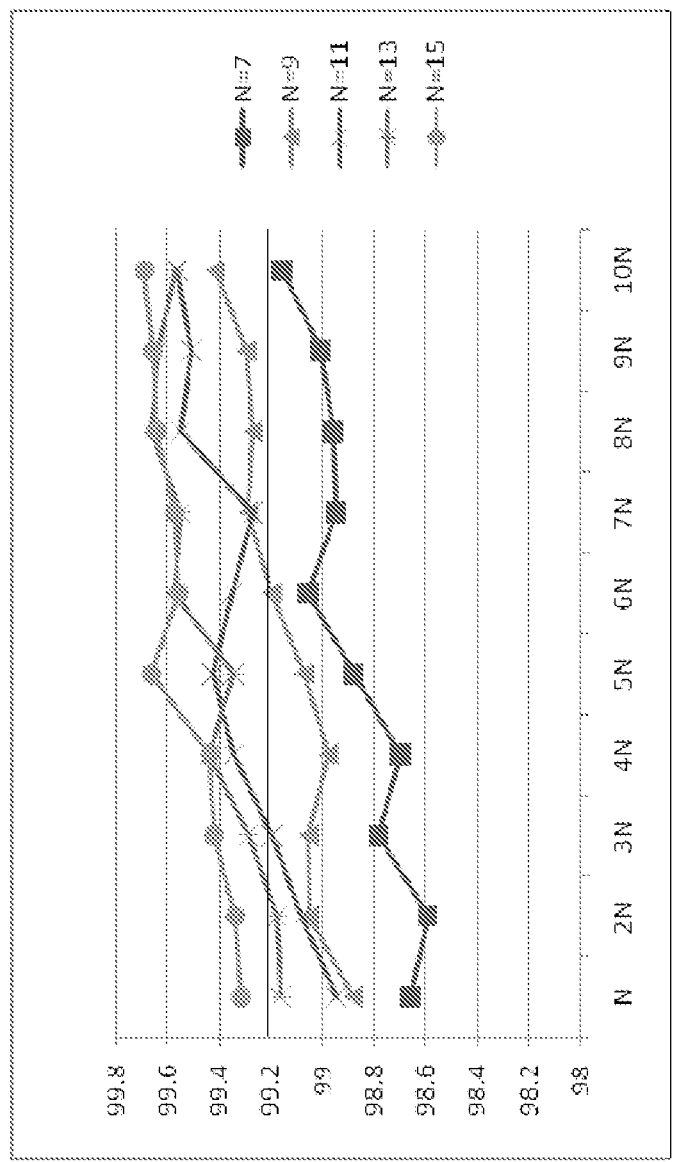
FIG. 18 illustrates an average encoding efficiency of the modified ACD(N, 6, 6) under the restriction that one pre-selected shift register may be reseeded every N shift cycles in accordance with an embodiment of the present invention.

FIG. 18 illustrates an average encoding efficiency of the modified ACD(N, 6, 6) under the restriction that one pre-selected shift register is reseeded every N shift cycles in accordance with an embodiment of the present invention. The simulation data illustrated in FIG. 18 demonstrates an ability of an ACD to effectively incorporate the encoding process (dependencies of the decompressor scheme) in an ATPG implication process. More specifically, an encoding process identifies most necessary assignments for a specified care bit which effectively reduces non-solution area in test generation, decreases the probability of encoding conflicts and improves merging additional (secondary) faults in one test pattern. If the encoding process is capable of identifying all necessary assignments for each care bit, then the next care bit is always encodable. In the present embodiment, each sequential element of the pre-selected shift register may be associated with a group of $N^3$ scan cells within an interval of N consecutive shift cycles. Accordingly, the decompressed test stimulus can be viewed as a superposition of two test sequences: periodic (static) and streaming (dynamic) as was discussed in conjunction with FIG. 5. Other possible ATPG scenarios can include: 1) reseeding is disabled and the compression range is increased by increasing the length of one or more shift registers in order to achieve maximum test data reduction (no reseeding); 2) one or more shift registers are reseeded per N shift cycles (dynamic partial reseeding); 3) one or more shift registers are reseeded as needed (selective partial reseeding); and 4) a two-phase process wherein for a primary fault, the ATPG process has no constraints for the amount of supplied test data from a tester, while reseeding is disabled for merging secondary faults.

Figure 19:
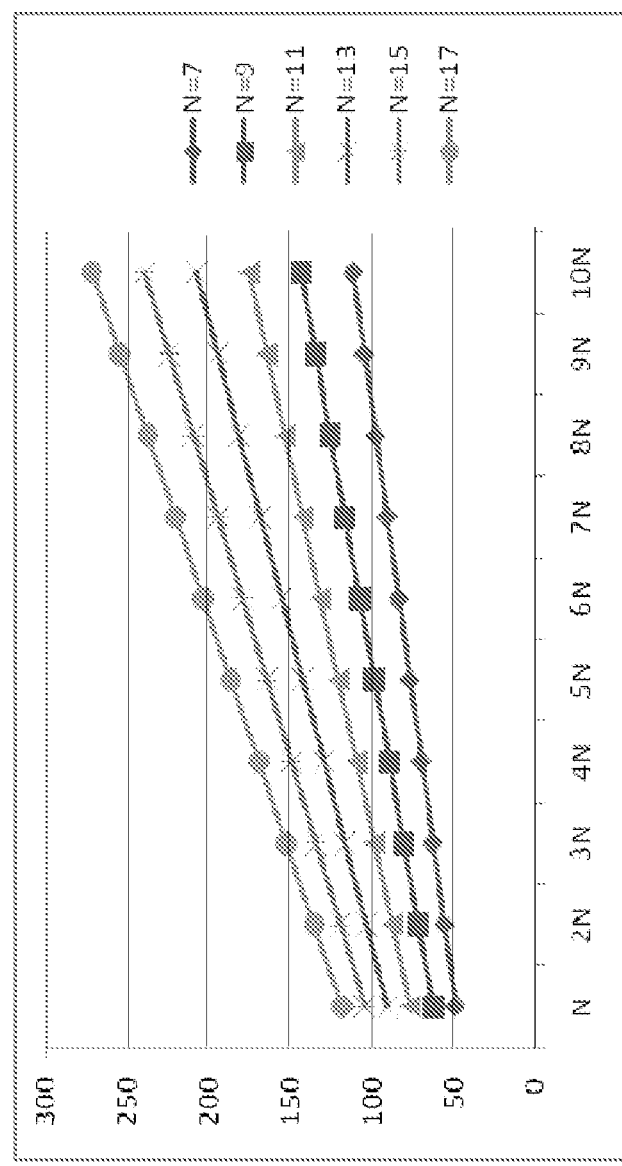
FIG. 19 illustrates the number of test data bits of the modified ACD(N, 6, 6) under the restriction that a pre-selected shift register is reseeded every N shift cycles in accordance with an embodiment of the present invention.

FIG. 19 illustrates the number of test data bits of the modified ACD(N, 6, 6) under the restriction that a pre-selected shift register is reseeded every N shift cycles in accordance with an embodiment of the present invention. The simulation data illustrated in FIG. 19 demonstrates an ability of the ACD to provide more test data bits while maintaining an efficient implication process during the ATPG. The amount of test data can be further increased by reseeding more than one shift register every N shift cycles. Accordingly, the encoding process includes two phases: 1) the first phase associated with the first 6N care bits such that a care bit is unlikely to imply other necessary assignments; and 2) the second phase occurring after the first encoding conflict wherein all scan cells in the first N shift cycles are assigned to a specific state and each consecutive care bit implies $N^3$, $N^2$ or N necessary assignments when one, two or three shift registers are reseeded every N shift cycles, respectively.

Figure 20:
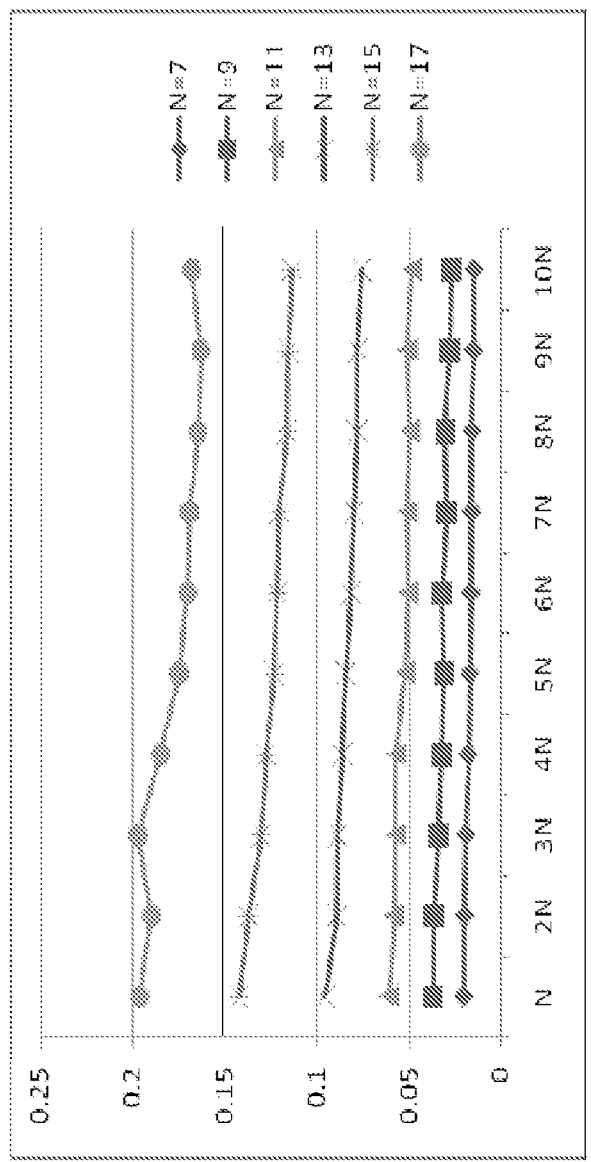
FIG. 20 illustrates an average CPU time in milliseconds per test data bits of the modified ACD(N, 6, 6) under the restriction that one pre-selected shift register may be reseeded every N shift cycles in accordance with an embodiment of the present invention.

FIG. 20 illustrates an average CPU time in milliseconds per test data bits of the modified ACD(N, 6, 6) under the restriction that one pre-selected shift register may be reseeded every N shift cycles in accordance with an embodiment of the present invention. The simulation data illustrated in FIG. 20 demonstrates that increasing the test data bits supplied by a tester actually does not increase the computational complexity for the encoding process, and the overall computational complexity strictly depends on the size of the decompressor that is equal to the lengths of all shift registers. In other words, the overall computational complexity of the encoding strictly depends on the number of static variables that is equal to the number of test data bits (static variables) in an initial seed. This result can be explained by splitting the encoding process at least two processes: static and dynamic. More specifically, the decompressor scheme is designed in a way that under certain conditions the variables may be partitioned into at least two sets, static and dynamic, that may be treated independently. This approach allows increasing the amount of test data bits without increasing the number of variables for the static encoding process having a dominant impact on the computational complexity. The number of variables is 6N while the number of test data bits is $6N+S \times N \times [L/N]$ where L is the length of scan chains and S is the number of reseeded shift registers per N shift cycles. For example, let N=17, L=170 and S=2, then the number of static variables is 102 and the number of dynamic variables is 340 while the number of test data bits is 102+340=442. A decompressor constructed based on this scheme can decompress the test stimulus to a design having up to 4913 scan chains, including up to 853210 scan cells. The CPU time for both static and dynamic encoding processes is expected to be around one second, which is considered a reasonable time for such a design size. In U.S. Pat. No. 6,327,687, both static and dynamic variables supplied by a tester are used in forming a system of linear equations. As a result, the computational complexity for solving the system of linear equations increases exponentially with respect to the number of the variables (supplied test data bits). In this way, it becomes infeasible to directly incorporate the encoding process into the ATPG implication process since the number of variables is large. As a result, the implication process does not fully utilize the degree of freedom in the ATPG. This limitation is resolved by some embodiments of the present invention by partitioning variables in to at least two sets that can be treated independently. As is illustrated by FIG. 20, this approach significantly reduces the computational complexity of the encoding process that allows the encoding process to be directly incorporated into the implication process. As a result, the enhanced implication process fully utilizes the degree of freedom in the ATPG. More specifically, multiple test cubes may satisfy detection criteria for a given fault. Some test cubes may be unencodable while other may be encodable. If the solving of system of linear equations (or encoding) is applied at the end of test generation for a given fault then there is always a risk the generated test cube may be unencodable. Therefore, reducing the computational complexity of the encoding process while improving the overall encoding efficiency is an important feature of some embodiments of the present invention. In this sense, the dynamic encoding process discussed in conjunction with FIG. 5 and FIG. 7 is a distinctive and advantageous feature of some embodiments of the present invention. More specifically, the dynamic variables associated with the dynamic encoding process have a limited scope of N shift cycles while the static variables associated with static encoding process have unlimited scope and they are valid until the next seed is loaded. As a result, the computational complexity per test data bit for the dynamic encoding process is expected to be N, $N^2$ or $N^3$ when one, two or three per-selected shift registers are reseeded every N shift cycles, respectively.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. An integrated circuit (IC) for decompressing test data from a tester and routing the decompressed test data into a set of scan chains within a circuit under test, the IC comprising:
   a decompressor circuit, which comprises:
      two or more shift registers configured to receive and shift the test data,
         wherein each of the two or more shift registers includes two or more sequential elements; and
         wherein at least one shift register in the two or more shift registers is configured as a circular shift register; and
      a logic network configured to receive the shifted test data from the two or more shift registers and generate the decompressed test data, wherein the logic network is coupled between the two or more shift registers and the set of scan chains which receives the decompressed test data from the logic network, wherein each logic gate in the logic network receives test data from at most one sequential element in each of the two or more shift registers.

2. The IC of claim 1, wherein the sequential elements in the at least one circular shift register are configured such that each sequential element receives test data from a preceding sequential element and supplies test data to a subsequent sequential element.

3. The IC of claim 1, wherein the logic network comprises a set of logic gates,
   wherein the set of logic gates comprises a set of XOR gates;
   wherein each of the set of XOR gates receives inputs from at most one sequential element within each of the two or more shift registers; and
   wherein each of the set of XOR gates is coupled to a unique one of the set of scan chains.

4. The IC of claim 1, wherein a pair of shift registers of the two or more shift registers are serially coupled such that a first sequential element of a first shift register is coupled to a last sequential element of a second shift register.

5. The IC of claim 1, wherein a swapping operation of the shift registers is controlled by at least one control bit, wherein a state 0 and 1 of the least one control bit selectively determines that each logic gate in the logic network receives the test data from a first set of sequential elements and a second set of sequential elements, respectively.

6. The IC of claim 1, wherein each of the two or more shift registers is configured as a circular shift register.

7. The IC of claim 1, wherein each sequential element in each of the two or more shift registers is coupled to a unique group of the set of scan chains.

8. The IC of claim 1, wherein the two or more shift registers include a first shift register of length M and a second shifter register of length N, wherein M and N are relative prime, wherein the first and second shift registers are coupled to the same group of the set of scan chains.

9. The IC of claim 1, wherein the decompressor circuit is configured to route the decompressed test data to the set of scan chains by using one of the following reseeding operations:
   a static reseeding operation;
   a dynamic reseeding operation;
   a dynamic partial reseeding operation; and
   a combination of the above.

10. The IC of claim 9, wherein the decompressor circuit uses at least one streaming channel coupled to the set of scan chains to perform a dynamic reseeding operation.

11. The IC of claim 1, wherein each of the set of scan chains is associated with a unique triplet identifier (x, y, z), wherein x, y, z are integers between 0 and N−1 (N≥2).

12. The IC of claim 11, wherein the two or more shift registers include K (K≥4) shift registers $R_i$ (i=0, 1, ..., K−1) of length at least N (N≥2), wherein the K shift registers are augmented by formulas: x, [(x+y) mod N], y, [(x+z) mod N], z, [(y+z) mod N] such that a formula is assigned to each shift register $R_i$.

13. The IC of claim 12, wherein the logic network comprises a set of connections such that each scan chain (x, y, z) is connected to the nth sequential element in the K shift registers $R_i$ (i=0, 1, ..., K−1),
   wherein n ∈ {0, 1, 2, ..., N−1} is the position of the connected sequential element in the respective shift register; and
   wherein n equals the formula augmenting the respective shift register evaluated by the set of numbers (x, y, z).

14. The IC of claim 13, wherein a scan chain (x, y, z) is decoupled from a shift register $R_j$ within the K shift registers, wherein j=(x+y+z) mod G, G is the larger one of (N, K).

15. A system, comprising:
   a tester configured to generate test data; and
   an integrated circuit comprising:
      a set of scan chains; and
      a decompressor circuit to decompress the test data and shift the decompressed test data into the set of scan chains during a plurality of shift cycles, wherein the decompressor circuit comprises:
         two or more shift registers configured to receive and shift the test data,
            wherein each of the two or more shift registers includes two or more sequential elements; and
            wherein at least one shift register in the two or more shift registers is configured as a circular shift register; and
         a logic network configured to receive the shifted test data from the two or more shift registers and generate the decompressed test data, wherein the logic network is coupled between the two or more shift registers and the set of scan chains which receives the decompressed test data from the logic network, wherein each logic gate in the logic network receives test data from at most one sequential element in each of the two or more shift registers.

16. The system of claim 15, wherein the sequential elements in the at least one circular shift register are configured such that each sequential element receives test data from a preceding sequential element and supplies test data to a subsequent sequential element.

17. The system of claim 15, wherein the set of logic gates comprises a set of XOR gates,
   wherein each of the set of XOR gates is coupled to one and only one sequential element within each of the two or more shift registers; and
   wherein each of the set of XOR gates is coupled to a unique one of the set of scan chains.

18. The system of claim 15, wherein a pair of shift registers of the two or more shift registers are serially coupled such that a first sequential element of a first shift register is coupled to a last sequential element of a second shift register.

19. The system of claim 15, wherein a swapping operation is controlled by at least one control bit wherein a state 0 and 1 of the at least one control bit selectively determines that each logic gate in the logic network receives the test data from a first set of sequential elements and a second set of sequential elements, respectively.

20. The system of claim 15, wherein each of the set of scan chains is associated with a unique triplet identifier $(x, y, z)$, wherein $x, y, z$ are integers between 0 and $N-1$ ($N \geq 2$).

21. The system of claim 20, wherein the two or more shift registers include K ($K \geq 4$) shift registers $R_i$ ($i=0, 1, \ldots, K-1$) of length at least N ($N \geq 2$), wherein the K shift registers $R_i$ are augmented by formulas: $x, [(x+y) \bmod N], y, [(x+z) \bmod N], z, [(y+z) \bmod N]$ by assigning a formula to each shift register.

22. The system of claim 21, wherein each scan chain $(x, y, z)$ is connected to the nth sequential element in each of the K shift registers $R_i$ ($i=0, 1, \ldots, K-1$),
- wherein $n \in \{0, 1, 2, \ldots, N-1\}$ is the position of the connected sequential element in the respective shift register; and
- wherein n equals the formula augmenting the respective shift register evaluated by the set of numbers $(x, y, z)$.

23. The system of claim 22, wherein a scan chain $(x, y, z)$ is decoupled from a shift register $R_j$ within the K shift registers, wherein $j=(x+y+z) \bmod G$, where G is the larger one of (N, K).

24. A method for constructing a decompressor circuit for decompressing test data from a tester and routing the decompressed test data into a set of scan chains within a circuit under test, the method comprising:
- receiving the set of scan chains;
- receiving two or more shift registers configured to receive and shift the test data from the tester;
  - wherein each of the two or more shift registers includes two or more sequential elements; and
- wherein at least one shift register in the two or more shift registers is configured as a circular shift register; and
- coupling a logic network between the two or more shift registers and the set of scan chains, wherein the logic network is configured to receive the shifted test data from the two or more shift registers and generate the decompressed test data, and wherein the set of scan chains receives the decompressed test data from the logic network, wherein each logic gate in the logic network receives test data from at most one sequential element in each of the two or more shift registers.

25. The method of claim 24, wherein the sequential elements in the at least one circular shift register are configured such that each sequential element receives test data from a preceding sequential element and supplies test data to a subsequent sequential element.

26. The method of claim 24, wherein the two or more shift registers include K shift registers $R_i$ ($i=0, 1, \ldots, K-1$) of length at least N ($N \geq 2$) wherein $K \geq 4$.

27. The method of claim 26, wherein coupling the set of scan chains to the two or more shift registers to form the logic network involves:
- assigning a unique triplet identifier $(x, y, z)$ to each of the set of scan chains, wherein $x, y, z$ are integers between 0 and $N-1$ ($N \geq 2$);
- assigning a formula in a set of formulas: $x, [(x+y) \bmod N], y, [(x+z) \bmod N], z, [(y+z) \bmod N]$ to each of the K shift registers $R_i$ ($i=0, 1, \ldots, K-1$); and
- coupling each scan chain $(x, y, z)$ to the nth sequential element in each of the K shift registers $R_i$,
  - wherein $n \in \{0, 1, 2, \ldots, N-1\}$ is the position of the coupled sequential element in the respective shift register; and
- wherein n equals the formula augmenting the respective shift register evaluated by the set of numbers $(x, y, z)$.

* * * * *